(12) United States Patent
Tachibana

(10) Patent No.: US 12,555,900 B2
(45) Date of Patent: Feb. 17, 2026

(54) FILTER DEVICE, ANTENNA APPARATUS, AND ANTENNA MODULE

(71) Applicant: Murata Manufacturing Co., Ltd., Nagaokakyo (JP)

(72) Inventor: Shinya Tachibana, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 106 days.

(21) Appl. No.: 18/596,816

(22) Filed: Mar. 6, 2024

(65) Prior Publication Data
US 2024/0213665 A1    Jun. 27, 2024

Related U.S. Application Data

(63) Continuation of application No. PCT/JP2022/041921, filed on Nov. 10, 2022.

(30) Foreign Application Priority Data

Nov. 22, 2021 (JP) ................................. 2021-189150

(51) Int. Cl.
*H01Q 1/50* (2006.01)
*H03H 7/01* (2006.01)

(52) U.S. Cl.
CPC ............. *H01Q 1/50* (2013.01); *H03H 7/0115* (2013.01); *H03H 7/175* (2013.01)

(58) Field of Classification Search
CPC ............ H01Q 1/22; H01Q 1/50; H01Q 1/243; H01Q 1/378; H01Q 1/521; H01Q 5/335; H01Q 5/342; H03H 5/02; H03H 7/09; H03H 7/175; H03H 7/0115
See application file for complete search history.

(56) References Cited

U.S. PATENT DOCUMENTS 6,329,886 B1   12/2001  Ogoro
7,250,910 B2*  7/2007  Yoshikawa ............ H01Q 21/24
                                          343/702

(Continued)

FOREIGN PATENT DOCUMENTS

JP    H0629753 A       2/1994
JP    2000036721 A     2/2000

(Continued)

OTHER PUBLICATIONS

International Search Report in PCT/JP2022/041921, mailed Jan. 31, 2023, 3 pages.

(Continued)

*Primary Examiner* — Tung X Le
(74) *Attorney, Agent, or Firm* — Keating & Bennett, LLP

(57) ABSTRACT

A filter device includes a first LC series resonator to resonate in series at a first series resonant frequency with a first inductor and a first capacitor, and a second LC series resonator to resonate in series at a second series resonant frequency with a second inductor and a second capacitor. The first and second LC series resonators are connected in parallel and resonate in parallel at a parallel resonant frequency. The second series resonant frequency is lower than the first series resonant frequency. The parallel resonant frequency is between the first and second series resonant frequencies.

20 Claims, 18 Drawing Sheets

(56) References Cited

U.S. PATENT DOCUMENTS

| | | | | |
|---|---|---|---|---|
| 2004/0217915 A1* | 11/2004 | Imaizumi | ................ | H03H 7/38 |
| | | | | 343/860 |
| 2017/0214378 A1* | 7/2017 | Black | ...................... | H01Q 5/50 |
| 2018/0041182 A1* | 2/2018 | Nishida | ............... | H03H 7/1791 |
| 2021/0250111 A1* | 8/2021 | Mori | ...................... | H03H 7/463 |
| 2022/0013907 A1* | 1/2022 | Sha | ......................... | H03H 7/38 |
| 2023/0344151 A1* | 10/2023 | Wu | ......................... | H01Q 9/42 |
| 2023/0352852 A1* | 11/2023 | Wu | ....................... | H01Q 1/241 |

FOREIGN PATENT DOCUMENTS

| | | | |
|---|---|---|---|
| JP | 2004336250 A | 11/2004 | |
| JP | 2015159488 A | 9/2015 | |
| JP | 2016092525 A | 5/2016 | |
| JP | 2016122706 A | 7/2016 | |
| JP | 6531824 B2 | 6/2019 | |
| WO | 2017199745 A1 | 11/2017 | |

OTHER PUBLICATIONS

Written Opinion in PCT/JP2022/041921, mailed Jan. 31, 2023, 4 pages.

\* cited by examiner

FILTER DEVICE, ANTENNA APPARATUS, AND ANTENNA MODULE

CROSS REFERENCE TO RELATED APPLICATIONS

This application claims the benefit of priority to Japanese Patent Application No. 2021-189150 filed on Nov. 22, 2021 and is a Continuation Application of PCT Application No. PCT/JP2022/041921 filed on Nov. 10, 2022. The entire contents of each application are hereby incorporated herein by reference.

BACKGROUND OF THE INVENTION

1. Field of the Invention

The present disclosure relates to filter devices, antenna apparatuses, and antenna modules, and, more particularly, to techniques for reducing a signal loss.

2. Description of the Related Art

A filter device, such as a band elimination filter or a band pass filter, is provided in a radio frequency circuit. Examples of a filter device provided in a radio frequency circuit include the filter device disclosed in Japanese Patent No. 6531824. The filter device disclosed in Japanese Patent No. 6531824 includes a first inductor and a first capacitor that form a first series circuit and a second inductor connected in parallel to the first series circuit.

SUMMARY OF THE INVENTION

In the filter device disclosed in Japanese Patent No. 6531824, reactance characteristics increase at frequencies lower than an attenuation band of parallel resonance as compared with the case where only the second inductor is used. Accordingly, a signal loss occurs in the filter device disclosed in Japanese Patent No. 6531824 because of deviation of an impedance.

Example embodiments of the present invention reduce a signal loss in a frequency band lower than an attenuation band of parallel resonance in a filter device for radio frequency signals.

A filter device according to an example embodiment of the present disclosure includes a first series resonator to resonate in series at a first resonant frequency with a first inductor and a first capacitor connected in series to the first inductor and a second series resonator to resonate in series at a second resonant frequency with a second inductor and a second capacitor connected in series to the second inductor. The first series resonator and the second series resonator are connected in parallel to each other and resonate in parallel at a third resonant frequency. The second resonant frequency is lower than the first resonant frequency. The third resonant frequency is between the first resonant frequency and the second resonant frequency.

A filter device according to another example embodiment of the present disclosure includes a first series resonator to resonate in series at a first resonant frequency with a first inductor and a first capacitor and a second series resonator to resonate in series at a second resonant frequency with a second inductor and a second capacitor. The first series resonator and the second series resonator are connected in parallel to each other to resonate in parallel at a third resonant frequency in a third frequency band. With such a configuration, a signal loss can be reduced at frequencies lower than an attenuation band of parallel resonance.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
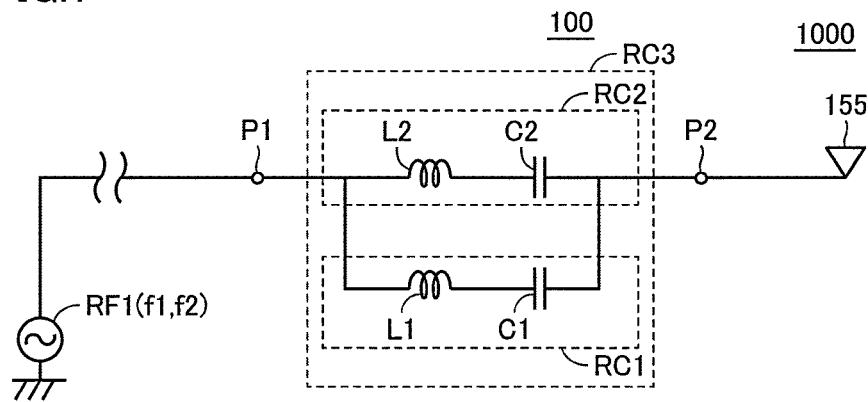
FIG. 1 is a diagram illustrating the configuration of an antenna apparatus according to a first example embodiment of the present invention.

Example embodiments of the present disclosure will be described in detail below with reference to drawings. The same reference numeral is used to represent the same element or feature or the corresponding element or feature in the drawings, and the description thereof will not be repeated.

First Example Embodiment

Basic Configuration of Antenna Apparatus

FIG. 1 is a diagram illustrating the configuration of an antenna apparatus 1000 according to the first example embodiment. The antenna apparatus 1000 includes a feed circuit RF1, a filter device 100, and an antenna 155. The antenna apparatus 1000 may be installed in, for example, a mobile terminal, such as a smartphone or a tablet computer, or a communication apparatus, such as a personal computer having a communication function.

The feed circuit RF1 supplies to the antenna 155 a radio frequency signal in a frequency band in the f1 band and a radio frequency signal in a frequency band in the f2 band. The antenna 155 can radiate a radio frequency signal in the f1 band and a radio frequency signal in the f2 band supplied from the feed circuit RF1 into air as radio waves. A frequency band in the f1 band is, for example, the Wi-Fi® 5 GHz band (e.g., about 5.15 GHz to about 5.7 GHz). A frequency band in the f2 band is, for example, the Wi-Fi® 2.4 GHz band (e.g., about 2.4 GHz to about 2.5 GHz). The antenna 155 is, for example, a monopole antenna.

The filter device 100 is a trap filter to prevent the passage of a radio frequency signal in a specific frequency band and attenuate the radio frequency signal. The filter device 100 is also referred to as a band elimination filter. The filter device 100 according to the first example embodiment is configured to attenuate a radio frequency signal in a frequency band in the f3 band. For example, a frequency band in the f3 band includes n77 (e.g., about 3.3 GHz to about 4.2 GHz) and n78 (e.g., about 3.3 GHz to about 3.8 GHz) in 5G-NR (New Radio).

The f1 to f3 bands are adjacent frequency bands. The determination of whether frequency bands are adjacent to each other can be made with a bandwidth and a center frequency with respect to the bandwidth. For example, when the ratio of a center frequency to a bandwidth between the frequency end of the f1 band and the frequency end of the f2 band is in a predetermined range, the f1 and f2 bands are determined to be adjacent to each other. The determination of whether frequency bands are adjacent to each other may be made with another method. In the filter device 100, the f1 and f2 bands are passbands and the f3 band is an attenuation band.

The filter device 100 illustrated in FIG. 1 includes a terminal P1 and a terminal P2. The terminal P1 is used to connect the filter device 100 to a transmission line on the feed circuit RF1 side. The terminal P2 is used to connect the filter device 100 to a transmission line on the antenna 155 side.

In the case where the feed circuit RF1 supplies a radio frequency signal to the antenna 155 via the filter device 100, the terminal P1 functions as an input terminal and the terminal P2 functions as an output terminal. In the case where a radio frequency signal received by the antenna 155 is transmitted to a circuit on the feed circuit RF1 side via the filter device 100, the terminal P1 functions as an output terminal and the terminal P2 functions as an input terminal. The filter device 100 does not include a grounding electrode and can be easily disposed in respective apparatuses without the need to consider the effects of a wiring patterns.

As illustrated in FIG. 1, the filter device 100 includes an inductor L1, a capacitor C1, an inductor L2, and a capacitor C2. An LC series resonator RC1 is defined by the series connection between the inductor L1 and the capacitor C1. An LC series resonator RC2 is defined by the series connection between the inductor L2 and the capacitor C2.

The LC series resonators RC1 and RC2 are connected in parallel. An LC parallel resonator RC3 is defined by the parallel connection between the LC series resonators RC1 and RC2. The LC series resonators RC1 and RC2 and the LC parallel resonator RC3 are disposed between the terminals P1 and P2.

Figure 2:
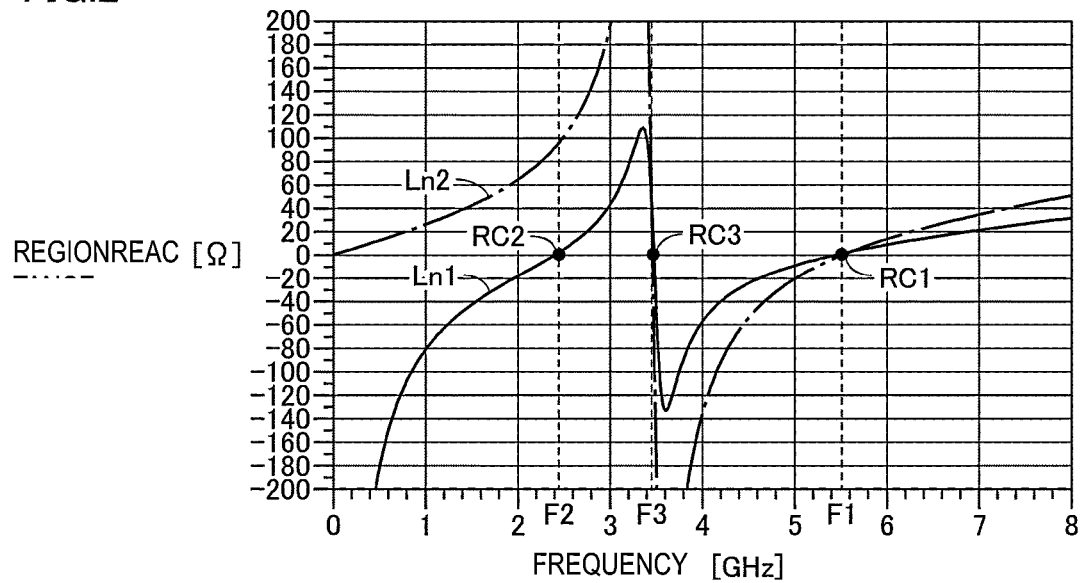
FIG. 2 is a diagram illustrating exemplary reactance characteristics of a filter device according to the first example embodiment of the present invention.
Figure 3:
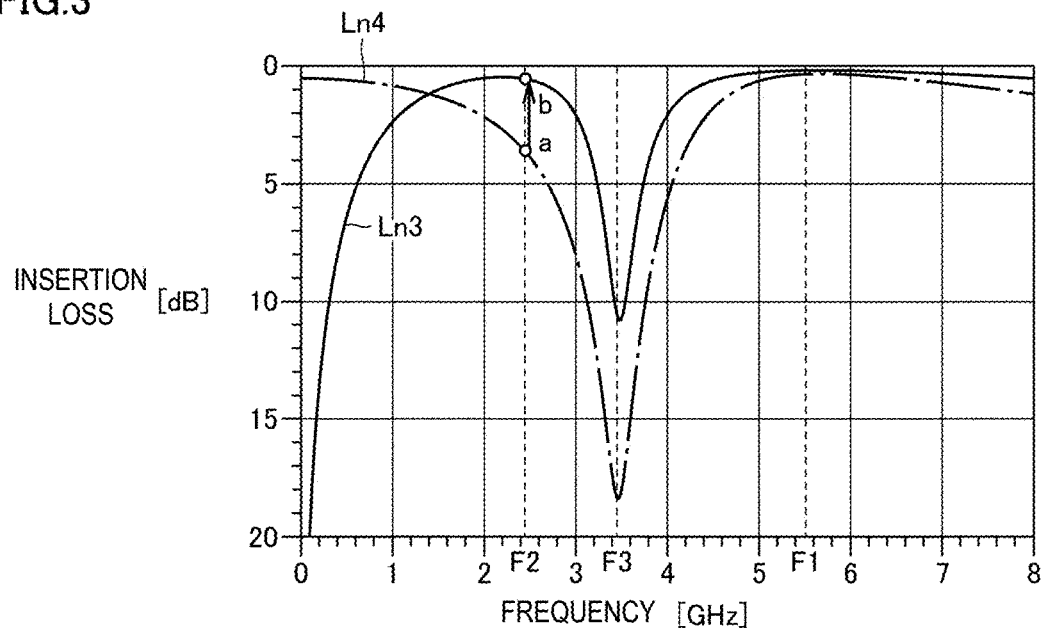
FIG. 3 is a diagram illustrating an exemplary insertion loss of a filter device according to the first example embodiment of the present invention.

FIG. 2 is a diagram illustrating exemplary reactance characteristics of the filter device 100 according to the first example embodiment. Referring to FIG. 2, the horizontal axis represents frequency and the vertical axis represents reactance. FIG. 3 is a diagram illustrating an exemplary insertion loss of the filter device 100 according to the first example embodiment. Referring to FIG. 3, the horizontal axis represents frequency and the vertical axis represents insertion loss.

In FIG. 2, the reactance characteristics of the filter device 100 according to the first example embodiment are represented by a line Ln1 and the reactance characteristics of a filter device that is a subject of comparison are represented by a line Ln2. Although not illustrated, the filter device that is a subject of comparison has a configuration in which the inductor L2 is connected in parallel to an LC series resonator including the inductor L1 and the capacitor C1.

Specifically, in the filter device 100, a simulation was conducted under example conditions that the inductor L1 had 1.4 nH, the inductor L2 had 3.98 nH, the capacitor C1 had 0.6 pF, and the capacitor C2 had 1.1 pF. In a filter device that is a subject of comparison, a simulation was conducted under example conditions that the inductor L1 had 2.6 nH, the inductor L2 had 3.98 nH, and the capacitor C1 had 0.32 pF.

As represented by the line Ln2 in FIG. 2, a series resonant frequency F1 in a passband (the f1 band) of the filter device that is a subject of comparison is 5.5 GHz and a parallel resonant frequency F3 in an attenuation band (the f3 band) of the filter device is 3.5 GHz. However, a reactance cannot be zero at frequencies lower than the parallel resonant frequency F3 in the filter device that is a subject of comparison.

As represented by the line Ln1, the series resonant frequency F1 in the passband (the f1 band) is 5.5 GHz, a series resonant frequency F2 in the passband (the f2 band) is 2.4 GHz, and the parallel resonant frequency F3 in the attenuation band (the f3 band) is 3.5 GHz in the filter device 100. Thus, in the filter device 100, a reactance can be zero at the series resonant frequency F2 lower than the parallel resonant frequency F3.

Referring to FIG. 3, the insertion loss of the filter device 100 according to the first example embodiment is represented by a line Ln3 and the insertion loss of the filter device that is a subject of comparison is represented by a line Ln4. As is apparent from FIG. 3, the insertion loss at the series resonant frequency F2 decreases from a value at a point a of the filter device that is a subject of comparison to a value at a point b of the filter device 100. Thus, a signal loss can be reduced at the series resonant frequency F2 lower than the parallel resonant frequency F3 in the filter device 100.

The filter device 100 is provided in the antenna apparatus 1000 capable of radiating the series resonant frequencies F1 and F2 as resonant frequencies. The antenna apparatus 1000 can therefore appropriately transmit and receive signals in the passbands (the f1 and f2 bands).

Second Example Embodiment

Basic Configuration of Filter Device

Figure 4A:
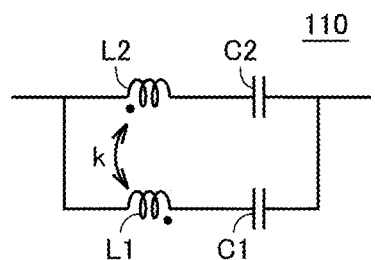
FIGS. 4A and 4B are circuit diagrams and equivalent circuit diagrams of a filter device according to a second example embodiment of the present invention.
Figure 4B:
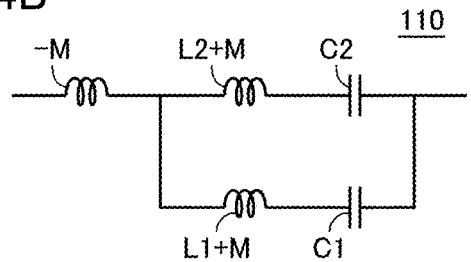

FIGS. 4A and 4B are circuit diagrams and equivalent circuit diagrams of a filter device 110 according to the second example embodiment. As illustrated in the circuit diagram in FIG. 4A, the filter device 110 according to the second example embodiment has the same configuration as the filter device 100 according to the first example embodiment except that the inductors L1 and L2 are magnetically coupled to each other. In the filter device 110, a mutual inductance M occurs between the inductors L1 and L2. The filter device 110 is a positive polarity circuit in which the winding directions of respective coils in the inductors L1 and L2 are opposite.

FIG. 4B is the equivalent circuit diagram of the filter device 110 illustrated in FIG. 4A. Referring to FIG. 4B, a mutual inductance +M and a mutual inductance −M are illustrated.

Figure 5:
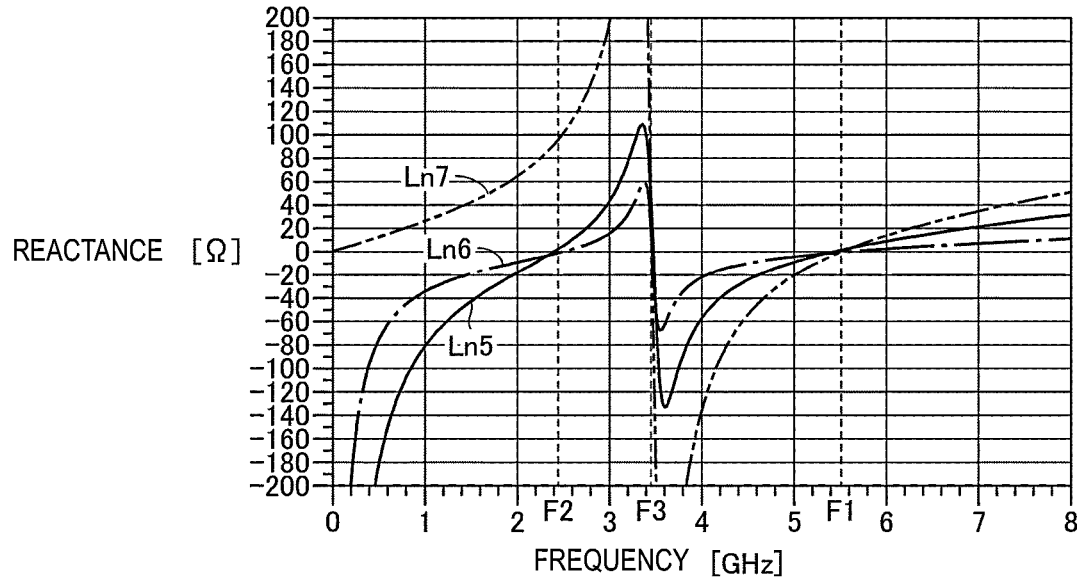
FIG. 5 is a diagram illustrating exemplary reactance characteristics of a filter device according to the second example embodiment of the present invention.
Figure 6:
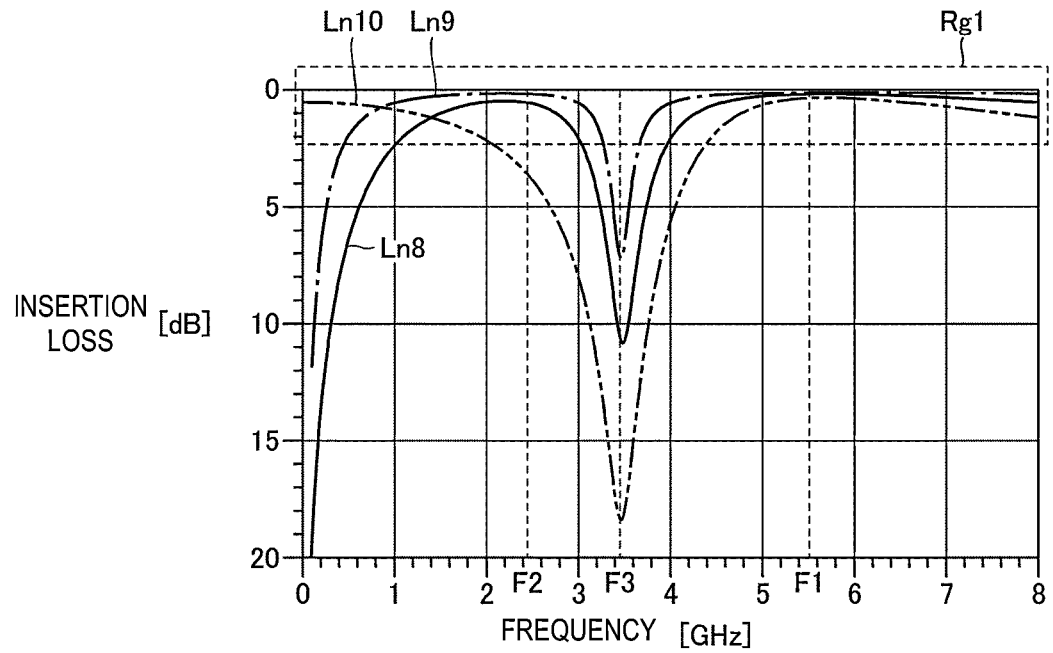
FIG. 6 is a diagram illustrating an exemplary insertion loss of a filter device according to the second example embodiment of the present invention.
Figure 7:
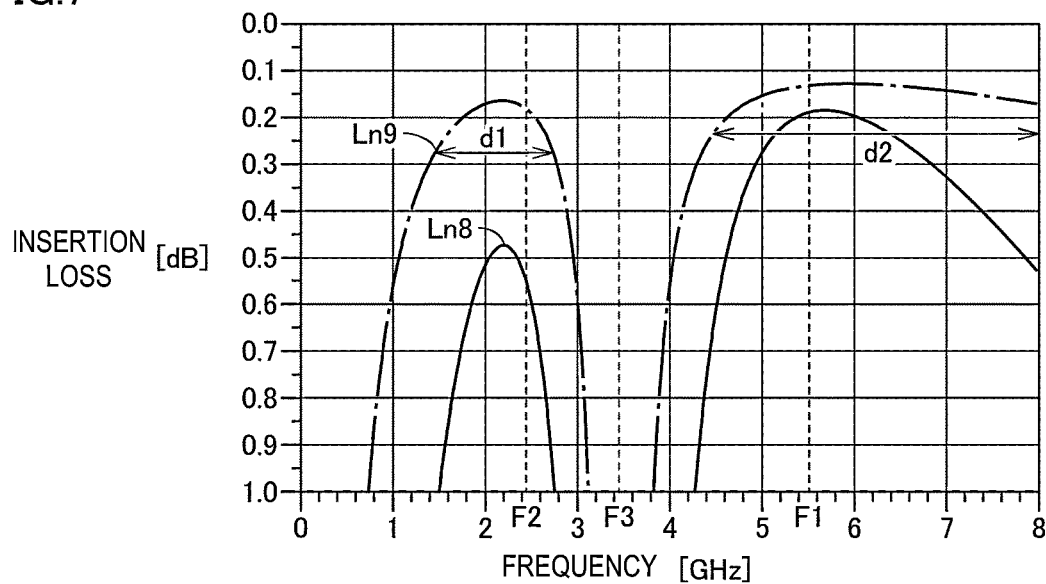
FIG. 7 is a vertical axis enlarged view of a region illustrated in FIG. 6.

FIG. 5 is a diagram illustrating exemplary reactance characteristics of the filter device 110 according to the second example embodiment. Referring to FIG. 5, the horizontal axis represents frequency and the vertical axis represents reactance. FIG. 6 is a diagram illustrating an exemplary insertion loss of the filter device 110 according to the second example embodiment. Referring to FIG. 6, the horizontal axis represents frequency and the vertical axis represents insertion loss. FIG. 7 is a vertical axis enlarged view of a region Rg1 illustrated in FIG. 6.

In FIG. 5, the reactance characteristics of the filter device 100 according to the first example embodiment with no magnetic coupling are represented by a line Ln5, the reactance characteristics of the filter device 110 according to the second example embodiment with magnetic coupling are represented by a line Ln6, and the reactance characteristics of the filter device that is a subject of comparison are represented by a line Ln7. In the filter device 110, the mutual inductance M is generated by magnetic coupling.

Specifically, in the filter device 100 according to the first example embodiment with no magnetic coupling, a simulation was conducted under example conditions that the inductor L1 had 1.4 nH, the inductor L2 had 3.98 nH, the capacitor C1 had 0.6 pF, and the capacitor C2 had 1.1 pF. In filter device 110 according to the second example embodiment with magnetic coupling, a simulation was conducted under example conditions that the inductor L1 had 3.1 nH, the inductor L2 had 1.0 nH, the capacitor C1 had 0.4 pF, the capacitor C2 had 3.8 pF, a coupling coefficient k was 0.5, and the mutual inductance M was 0.88 nH. In the filter device that is a subject of comparison, a simulation was conducted under example conditions that the inductor L1 had 2.6 nH, the inductor L2 had 3.98 nH, and the capacitor C1 had 0.32 pF.

As represented by the line Ln7 in FIG. 5, the series resonant frequency F1 in a passband (f1 band) is 5.5 GHz and the parallel resonant frequency F3 in an attenuation band (f3 band) is 3.5 GHz in the filter device that is a subject of comparison. However, in the filter device that is a subject of comparison, a reactance cannot be zero at frequencies lower than the parallel resonant frequency F3.

On the other hand, in the filter devices 100 and 110, the series resonant frequency F1 in a passband (f1 band) is 5.5 GHz, the series resonant frequency F2 in a passband (f2 band) is 2.4 GHz, and the parallel resonant frequency F3 in an attenuation band (f3 band) is 3.5 GHz as represented by the lines Ln5 and Ln6. Thus, in the filter devices 100 and 110, a reactance can be zero at the frequency F2 lower than the parallel resonant frequency F3.

In FIG. 6, the insertion loss of the filter device 100 according to the first example embodiment is represented by a line Ln8, the insertion loss of the filter device 110 according to the second example embodiment is represented by a line Ln9, and the insertion loss of the filter device that is a subject of comparison is represented by a line Ln10. As illustrated in FIG. 6, in the filter devices 100 and 110 having the series resonant frequency F2, an insertion loss can be suppressed near the series resonant frequency F2 as compared with the filter device that is a subject of comparison. That is, the filter devices 100 and 110 can be a narrowband filter device in which attenuation characteristics steeply change near the parallel resonant frequency F3 as compared with the filter device that is a subject of comparison.

FIG. 7 illustrates waveforms obtained by enlarging the vertical-axis (insertion loss) direction in the region Rg1 illustrated in FIG. 6. To make it easier to understand the difference between the lines Ln8 and Ln9, only the scale in the vertical-axis (insertion loss) direction is enlarged while the scale in the horizontal-axis (frequency) direction in FIG. 7 is the same as that in FIG. 6.

As illustrated in FIG. 7, the attenuation characteristics of the filter device 110 represented by the line Ln9 more steeply change near the parallel resonant frequency F3 than those of the filter device 100 represented by the line Ln8. Thus, because of occurrence of the mutual inductance M, the filter device 110 can reduce a signal loss in a wide frequency band d2 around the passband (f1 band) of the series resonant frequency F1 and also can reduce a signal loss in a wide frequency band d1 around the passband (f2 band) of the series resonant frequency F2 as compared with the filter device 100 with no magnetic coupling.

Next, the case will be described where comparison is performed again with the combination of an L value and a C value with which insertion losses are equal at the parallel resonant frequency F3. In comparison with FIGS. 5 to 7 described above, FIGS. 8 to 10 are diagrams when the value of the inductor L1 is reduced such that the reactance value and insertion loss of the filter device 100 with no magnetic coupling are at the same level as those of the filter device 110 with magnetic coupling.

Figure 8:
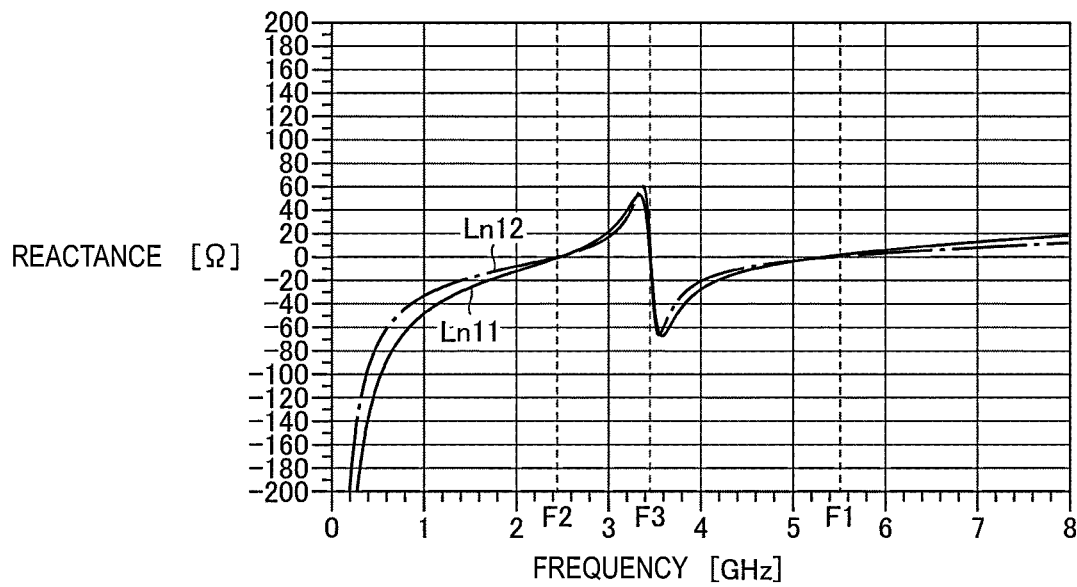
FIG. 8 is a diagram illustrating exemplary reactance characteristics of a filter device according to the second example embodiment of the present invention.
Figure 9:
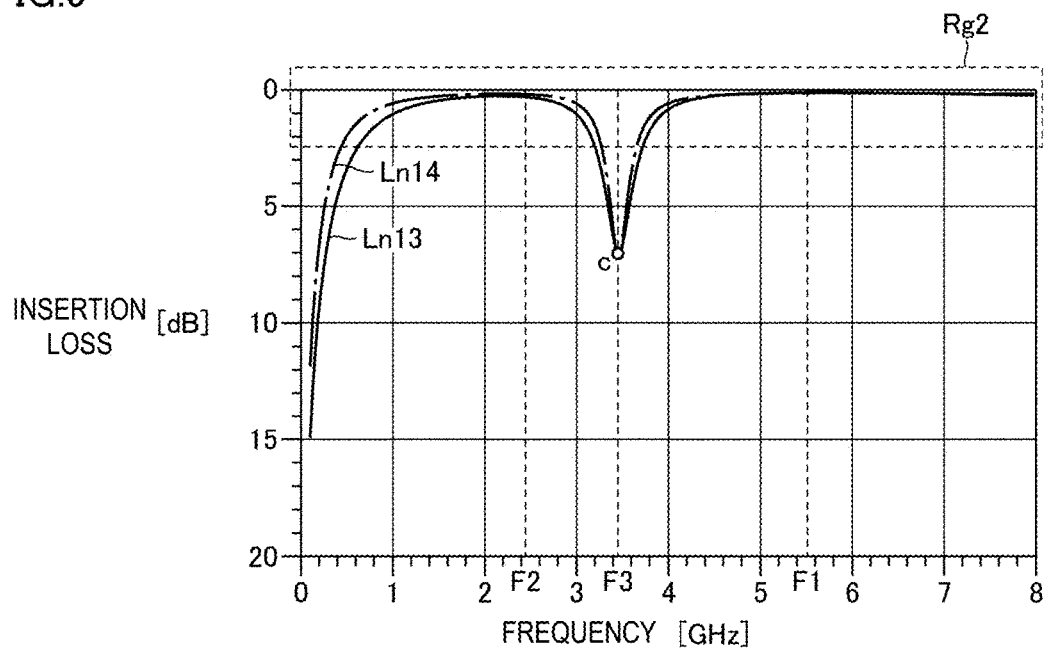
FIG. 9 is a diagram illustrating an exemplary insertion loss of a filter device according to the second example embodiment of the present invention.
Figure 10:
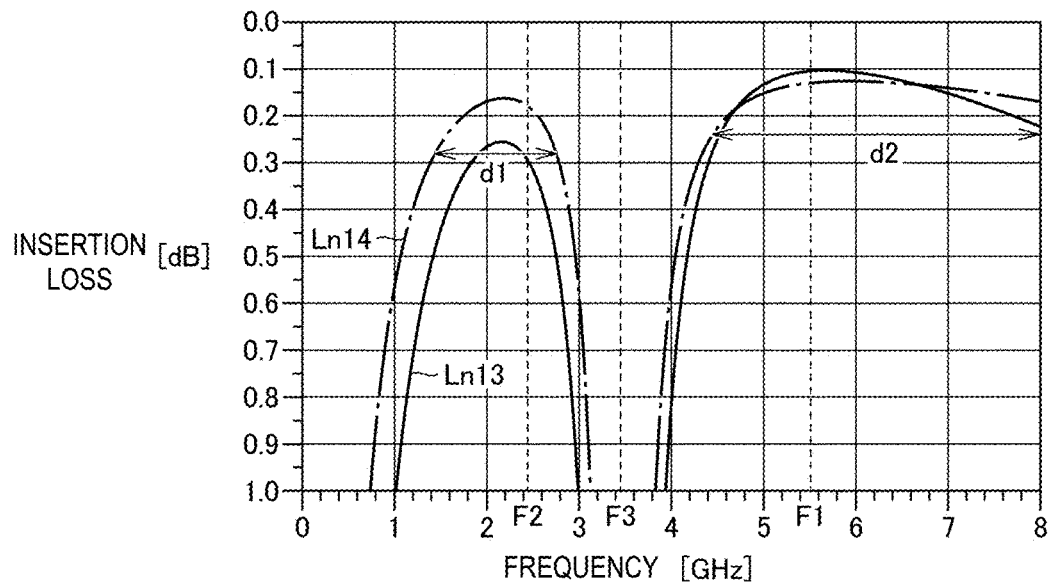
FIG. 10 is a vertical axis enlarged view of a region illustrated in FIG. 9.

FIG. 8 is a diagram illustrating exemplary reactance characteristics of the filter device 110 according to the second example embodiment. Referring to FIG. 8, the horizontal axis represents frequency and the vertical axis represents reactance. FIG. 9 is a diagram illustrating an exemplary insertion loss of the filter device 110 according to the second example embodiment. Referring to FIG. 9, the horizontal axis represents frequency and the vertical axis represents insertion loss. FIG. 10 is a vertical axis enlarged view of a region Rg2 illustrated in FIG. 9.

In FIG. 8, the reactance characteristics of the filter device 100 with no magnetic coupling are represented by a line Ln11 and the reactance characteristics of the filter device 110 according to the second example embodiment with magnetic coupling are represented by a line Ln12.

Specifically, in the filter device 100, a simulation was conducted under example conditions that the inductor L1 had 0.8 nH, the inductor L2 had 2.3 nH, the capacitor C1 had 1.1 pF, and the capacitor C2 had 1.8 pF. In the filter device 110, a simulation was conducted under example conditions that the inductor L1 had 3.1 nH, the inductor L2 had 1.0 nH, the capacitor C1 had 0.4 pF, the capacitor C2 had 3.8 pF, the coupling coefficient k was 0.5, and the mutual inductance M was 0.88 nH.

As represented by the lines Ln11 and Ln12 in FIG. 8, the series resonant frequency F1 in the passband (f1 band) is 5.5 GHz, the series resonant frequency F2 in the passband (f2 band) is 2.4 GHz, and the parallel resonant frequency F3 in the attenuation band (f3 band) is 3.5 GHz in the filter devices 100 and 110.

In FIG. 9, the insertion loss of the filter device 100 is represented by a line Ln13 and the insertion loss of the filter device 110 according to the second example embodiment is represented by a line Ln14. As illustrated in FIG. 9, reactance values at the parallel resonant frequency F3 are at the same level at a point c in the filter devices 100 and 110.

FIG. 10 illustrates waveforms obtained by enlarging the vertical-axis (insertion loss) direction in the region Rg2 illustrated in FIG. 9. To make it easier to understand the difference between the lines Ln13 and Ln14, only the scale in the vertical-axis (insertion loss) direction is enlarged while the scale in the horizontal-axis (frequency) direction in FIG. 10 is the same as that in FIG. 9.

As illustrated in FIG. 10, the attenuation characteristics of the filter device 110 represented by the line Ln14 more steeply change near the parallel resonant frequency F3 than those of the filter device 100 represented by the line Ln13. Even when insertion losses are at the same level, the filter device 110 can reduce a signal loss in the wide frequency band d2 around the passband (f1 band) of the series resonant frequency F1 and also can reduce a signal loss in the wide frequency band d1 around the passband (f2 band) of the series resonant frequency F2 as compared with the filter device 100 because of the presence of magnetic coupling.

First Modification of Second Example Embodiment

In the first modification of the second example embodiment, the case will be described where there is no need to set the passband (f1 band) of the series resonant frequency F1 in a frequency band near the parallel resonant frequency F3 in comparison with the second example embodiment.

Figure 11:
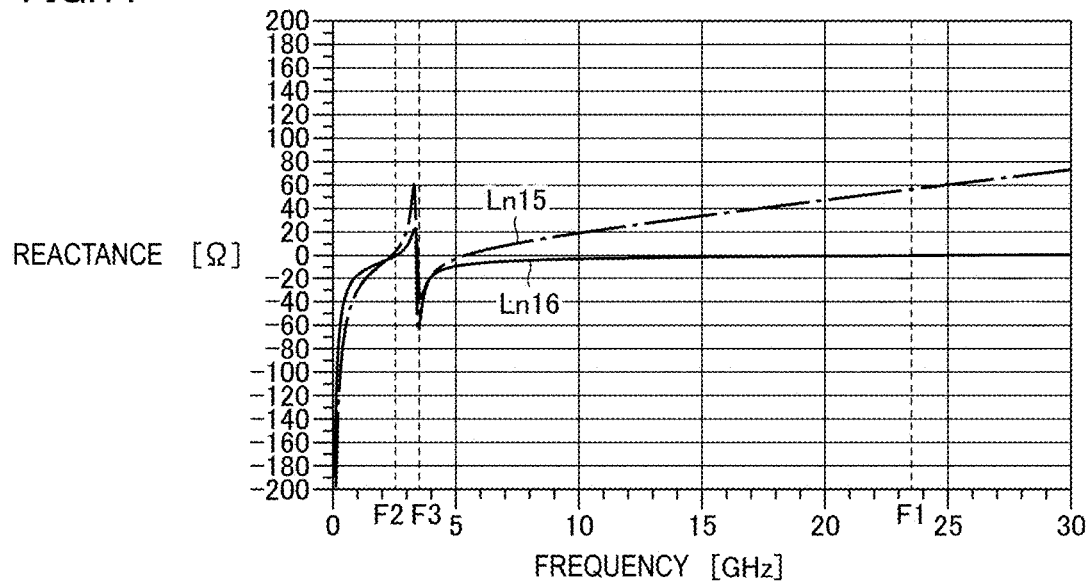
FIG. 11 is a diagram illustrating exemplary reactance characteristics of a filter device according to a first modification of the second example embodiment of the present invention.
Figure 12:
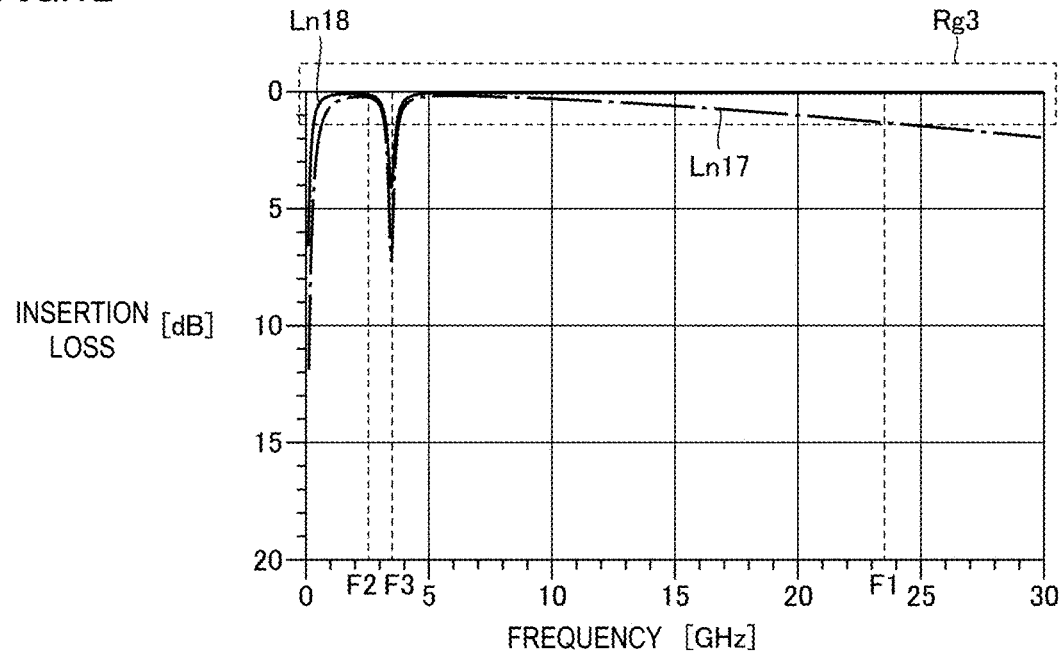
FIG. 12 is a diagram illustrating an exemplary insertion loss of a filter device according to the first modification of the second example embodiment of the present invention.
Figure 13:
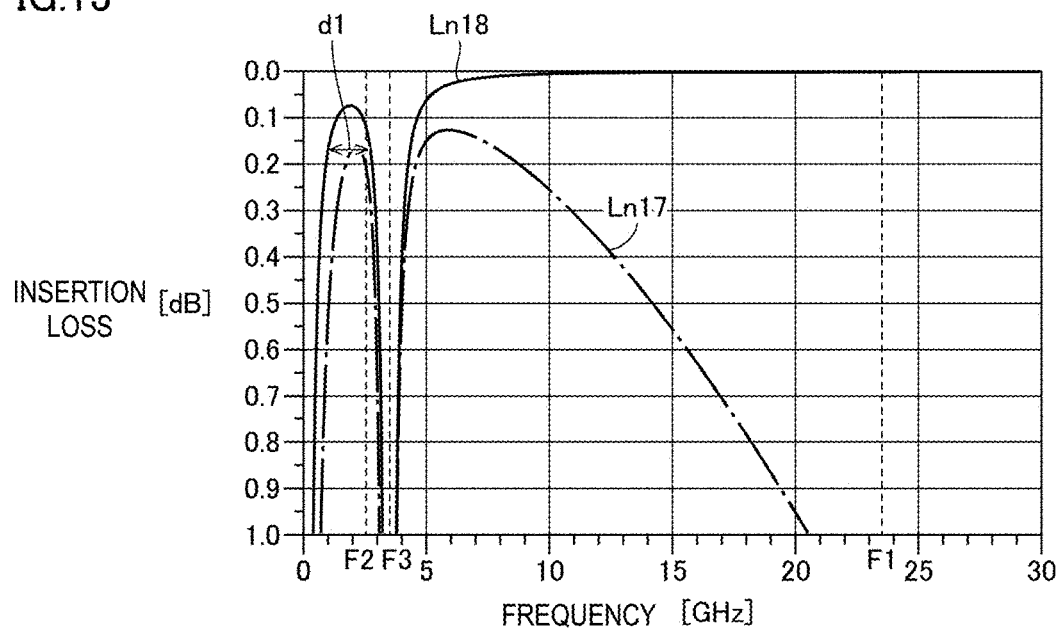
FIG. 13 is a vertical axis enlarged view of a region illustrated in FIG. 12.

FIG. 11 is a diagram illustrating exemplary reactance characteristics of a filter device according to the first modification of the second example embodiment. Referring to FIG. 11, the horizontal axis represents frequency and the vertical axis represents reactance. FIG. 12 is a diagram illustrating an exemplary insertion loss of a filter device according to the first modification of the second example embodiment. Referring to FIG. 12, the horizontal axis represents frequency and the vertical axis represents insertion loss. FIG. 13 is a vertical axis enlarged view of a region Rg3 illustrated in FIG. 12. FIGS. 11 to 13 illustrate the case where the passband (f1 band) of the series resonant frequency F1 is set at an extremely high frequency by reducing the inductor L1 as compared with the above case illustrated in FIGS. 5 to 7.

In FIG. 11, the reactance characteristics of the filter device 110 according to the second example embodiment are represented by a line Ln15 and the reactance characteristics of a filter device according to the first modification of the second example embodiment are represented by a line Ln16.

Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In a filter device according to the first modification, a simulation was conducted under example conditions that the inductor L1 had 0.01 nH, the inductor L2 had 1.0 nH, the capacitor C1 had 4.6 pF, the capacitor C2 had 3.8 pF, and the coupling coefficient k was 0.0.

As represented by the line Ln16 in FIG. 11, the series resonant frequency F1 in the passband (f1 band) is 23.5 GHz, the series resonant frequency F2 in the passband (f2 band) is 2.4 GHz, and the parallel resonant frequency F3 in the attenuation band (f3 band) is 3.5 GHz in the filter device according to the first modification. Thus, in the case where there is no need to set a passband near the higher-frequency side of the attenuation band (f3 band), only the series resonant frequency F1 can be changed while the series resonant frequency F2 and the parallel resonant frequency F3 are maintained by reducing the value of an inductor.

In FIG. 12, the insertion loss of the filter device 110 is represented by a line Ln17 and the insertion loss of a filter device according to the first modification is represented by a line Ln18. In the filter device according to the first modification illustrated in FIG. 12, the series resonant frequency F1 is set to an extremely high frequency.

FIG. 13 illustrates waveforms obtained by enlarging the vertical-axis (insertion loss) direction in the region Rg3 illustrated in FIG. 12. To make it easier to understand the difference between the lines Ln17 and Ln18, only the scale in the vertical-axis (insertion loss) direction is enlarged while the scale in the horizontal-axis (frequency) direction in FIG. 13 is the same as that in FIG. 12.

As illustrated in FIG. 13, a signal loss is smaller in the wide frequency band d1 around the passband (f2 band) of the series resonant frequency F2 on the lower-frequency side of the parallel resonant frequency F3 in the filter device according to the first modification represented by the line Ln18 as compared with the filter device 110 represented by the line Ln17. Thus, in the case where there is no need to set a passband near the higher-frequency side of the attenuation band (f3 band), a filter device according to the first modification can reduce a signal loss on the other side (e.g., lower-frequency side) of the attenuation band.

Second Modification of Second Example Embodiment

Basic Configuration of Filter Device

Figure 14:
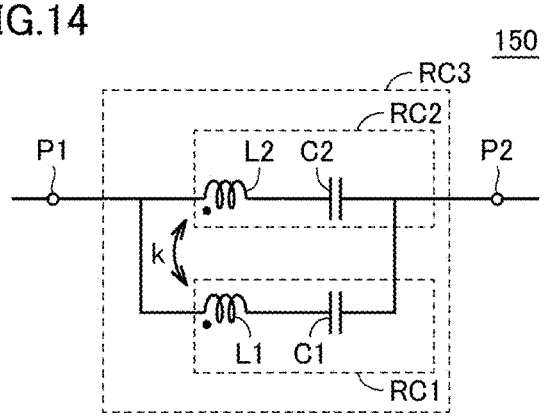
FIG. 14 is a circuit diagram of a filter device according to a second modification of the second example embodiment of the present invention.

FIG. 14 is a circuit diagram of a filter device 150 according to the second modification of the second example embodiment. As illustrated in the circuit diagram in FIG. 14, the inductors L1 and L2 are magnetically coupled to each other and the mutual inductance M occurs between the inductors L1 and L2 in the filter device 150 according to the second modification of the second example embodiment. The filter device 150 is a subtractive polarity circuit in which the winding directions of respective coils in the inductors L1 and L2 are the same.

Although not illustrated, the equivalent circuit diagram of the filter device 150 according to the second modification is a diagram in which the mutual inductance +M and the mutual inductance −M on the paths illustrated in FIG. 4B are changed to −M and +M, respectively.

Figure 15:
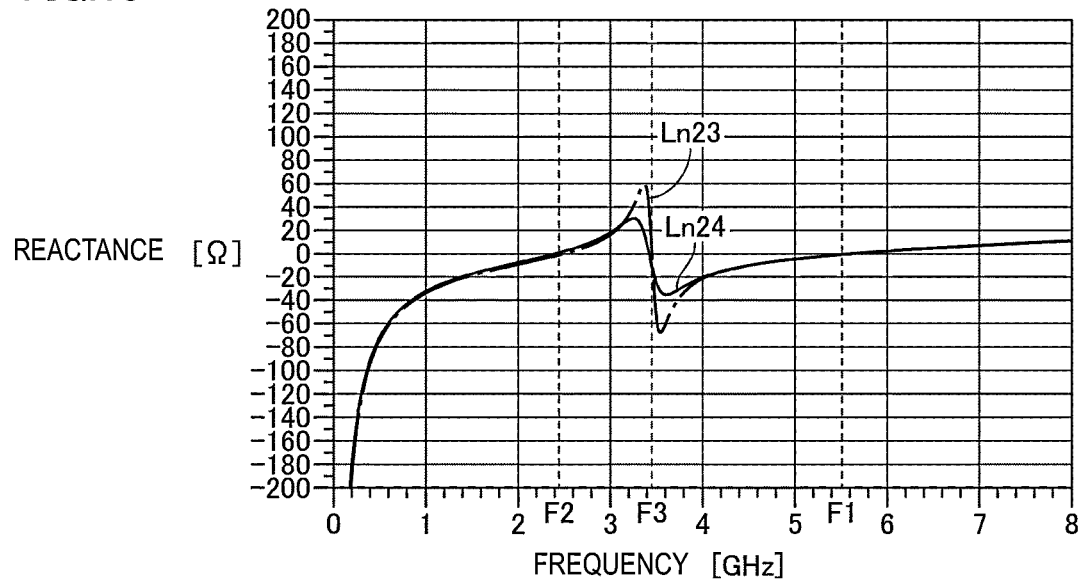
FIG. 15 is a diagram illustrating exemplary reactance characteristics of a filter device according to the second modification of the second example embodiment of the present invention.
Figure 16:
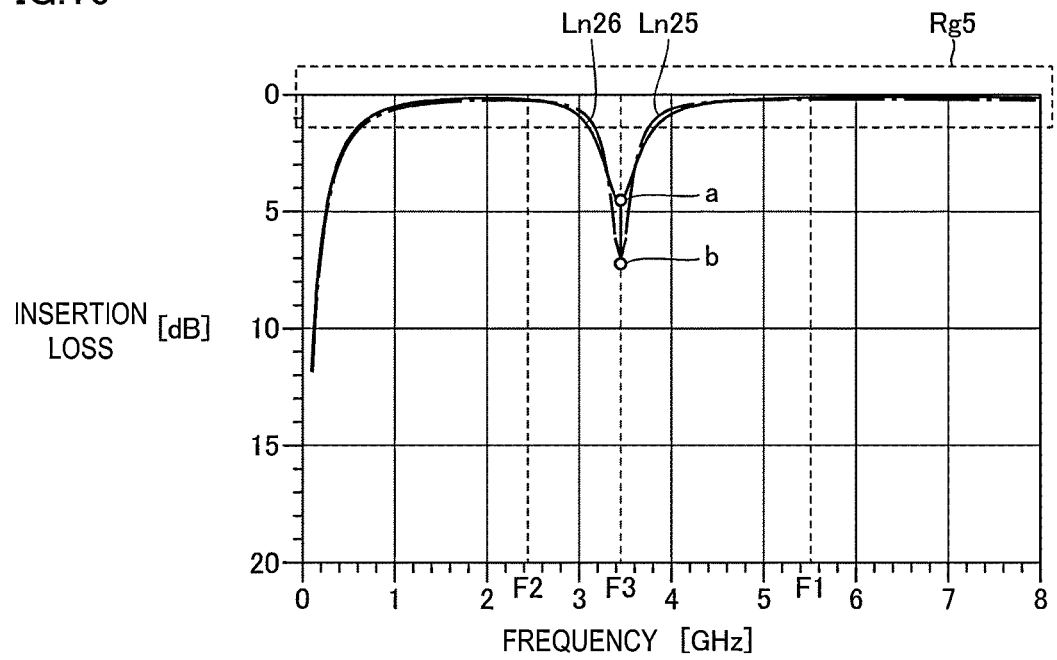
FIG. 16 is a diagram illustrating an exemplary insertion loss of a filter device according to the second modification of the second example embodiment of the present invention.
Figure 17:
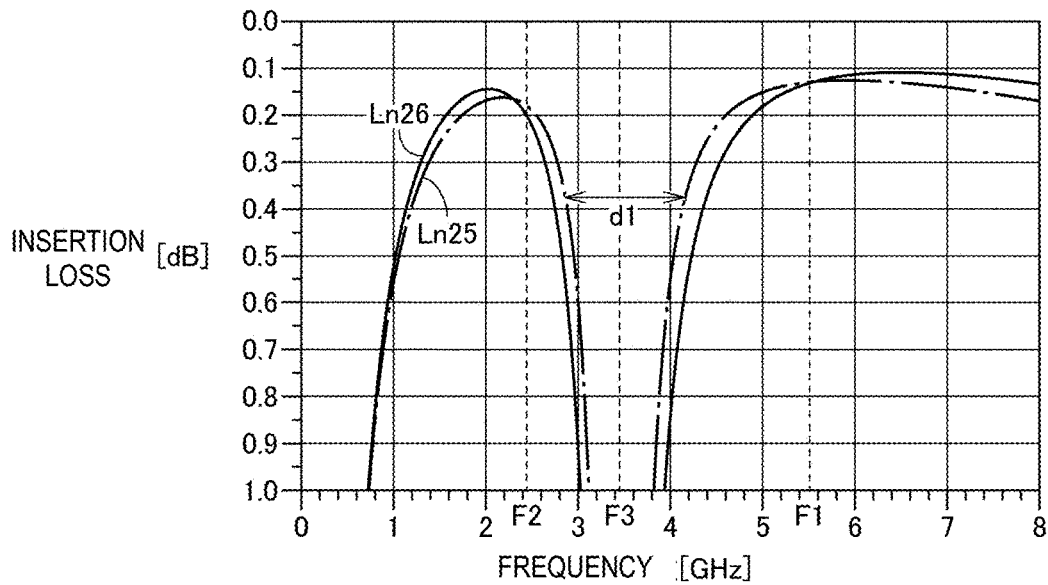
FIG. 17 is a vertical axis enlarged view of a region illustrated in FIG. 16.

FIG. 15 is a diagram illustrating exemplary reactance characteristics of the filter device 150 according to the second modification of the second example embodiment. Referring to FIG. 15, the horizontal axis represents frequency and the vertical axis represents reactance. FIG. 16 is a diagram illustrating an exemplary insertion loss of the filter device 150 according to the second modification of the second example embodiment. Referring to FIG. 16, the horizontal axis represents frequency and the vertical axis represents insertion loss. FIG. 17 is a vertical axis enlarged view of a region Rg5 illustrated in FIG. 16.

In FIG. 15, the reactance characteristics of the filter device 110 according to the second example embodiment are represented by a line Ln23 and the reactance characteristics of the subtractive polarity filter device 150 according to the second modification of the second example embodiment are represented by a line Ln24.

Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In the filter device 150 according to the second modification, a simulation was conducted under example conditions that the inductor L1 had 3.1 nH, the inductor L2 had 0.4 nH, the capacitor C1 had 1.3 pF, the capacitor C2 had 2.9 pF, and the coupling coefficient k was 0.5.

As represented by the lines Ln23 and Ln24 in FIG. 15, the series resonant frequency F1 in the passband (f1 band) is 5.5 GHz, the series resonant frequency F2 in the passband (f2 band) is 2.4 GHz, and the parallel resonant frequency F3 in the attenuation band (f3 band) is 3.5 GHz in the filter device 110 and the filter device 150 according to the second modification. Thus, in the filter device 110 and the filter device 150 according to the second modification, reactance can be zero at the series resonant frequency F2 lower than the parallel resonant frequency F3.

In FIG. 16, the insertion loss of the filter device 110 is represented by a line Ln25 and the insertion loss of the filter device 150 according to the second modification is represented by a line Ln26. As represented by an arrow from a point a to a point b in FIG. 16, the filter device 110 is narrowband filter device in which attenuation characteristics more steeply change near the parallel resonant frequency F3 as compared with the filter device 150 according to the second modification.

FIG. 17 illustrates waveforms obtained by enlarging the vertical-axis (insertion loss) direction in the region Rg5 illustrated in FIG. 16. To make it easier to understand the difference between the lines Ln25 and Ln26, only the scale in the vertical-axis (insertion loss) direction is enlarged while the scale in the horizontal-axis (frequency) direction in FIG. 17 is the same as that in FIG. 16.

As illustrated in FIG. 17, the attenuation characteristics of the filter device 110 represented by the line Ln25 more steeply change in the frequency band d1 near the parallel resonant frequency F3 than those of the subtractive polarity filter device 150 according to the second modification represented by the line Ln26. However, the filter device 150 according to the second modification can be said to have wider attenuation characteristics near the parallel resonant frequency F3 than the filter device 110.

As illustrated in FIG. 17, the signal loss of the subtractive polarity filter device 150 according to the second modification represented by the line Ln26 becomes lower than that of the positive polarity filter device 110 represented by the line Ln25 in a band apart from the parallel resonant frequency F3 (a band higher than F1 or a band lower than F2). Thus, even filter devices having the same configuration have different characteristics depending on whether the filter devices have a positive polarity or a subtractive polarity. A circuit designer can design a positive polarity circuit or a subtractive polarity circuit in consideration of characteristics that the circuit designer seeks.

Another Modification

Figure 18:
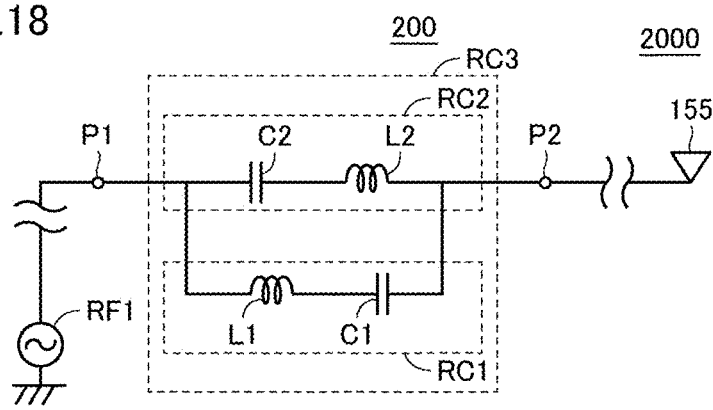
FIG. 18 is a diagram illustrating the configuration of an antenna apparatus according to another modification of an example embodiment of the present invention.

FIG. 18 is a diagram illustrating the configuration of an antenna apparatus 2000 according to another modification of an example embodiment of the present invention. The antenna apparatus 2000 includes the feed circuit RF1, a filter device 200, and the antenna 155. The antenna apparatus 2000 differs from the antenna apparatus 1000 according to the first example embodiment in the configuration of a filter device.

The filter device 200 includes the inductor L1, the capacitor C1, the inductor L2, and the capacitor C2 as illustrated in FIG. 18. The LC series resonator RC1 is defined by the series connection between the inductor L1 and the capacitor C1. The LC series resonator RC2 is defined by the series connection between the capacitor C2 and the inductor L2. The filter device 200 has a configuration in which the positions of the inductor L2 and the capacitor C2 in the filter device 100 are exchanged. A configuration may be used in which the positions of the inductor L1 and the capacitor C1 are exchanged.

Third Example Embodiment

Figure 19:
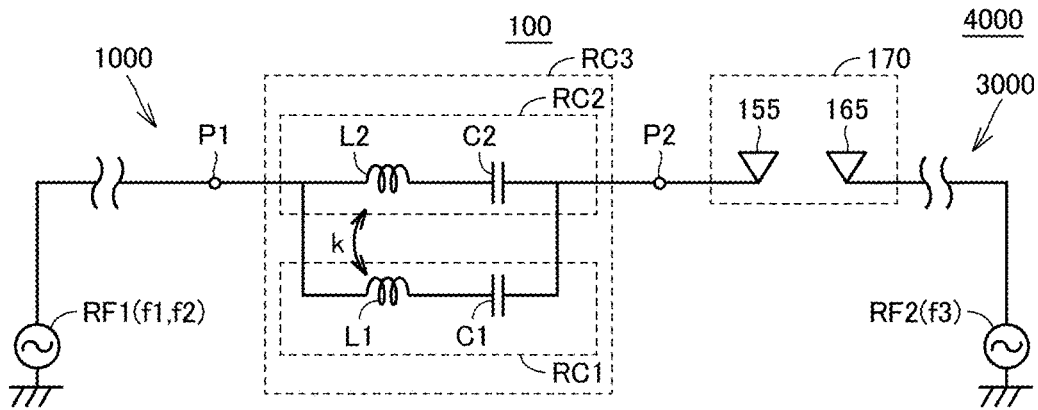
FIG. 19 is a diagram illustrating the configuration of an antenna module according to a third example embodiment of the present invention.

FIG. 19 is a diagram illustrating the configuration of an antenna module 4000 according to the third example embodiment. The antenna module 4000 includes the antenna apparatus 1000 and an antenna apparatus 3000. The antenna apparatus 3000 includes a feed circuit RF2 and an antenna 165. The antenna module 4000 may be installed in, for example, a mobile terminal, such as a smartphone or a tablet computer, or a communication apparatus, such as a personal computer having a communication function.

The configuration of the antenna apparatus 1000 is the same as the configuration according to the first example embodiment, and the description thereof will therefore be omitted. The feed circuit RF2 in the antenna apparatus 3000 supplies a radio frequency signal in a frequency band in the f3 band to the antenna 165. The antenna 165 can radiate a radio frequency signal in the f3 band supplied from the feed circuit RF2 into air as radio waves.

In the antenna apparatus 1000, a radio frequency signal in the f3 band radiated from the antenna apparatus 3000 provided in the antenna module 4000 in which the antenna apparatus 1000 is also provided may be noise. Accordingly, the filter device 100 is provided to remove a radio frequency signal in the f3 band that may be noise in the antenna apparatus 1000 by increasing an insertion loss due to parallel resonance.

The antennas 155 and 165 are mounted on the same substrate 170. The antennas 155 and 165 are provided on the same substrate 170 as illustrated in FIG. 19, but they may be provided on different substrates on condition that they are provided in the same antenna module 4000.

In the antenna module 4000, the filter device 100 in the antenna apparatus 1000 can reduce or prevent the effect of the antenna apparatus 3000. Accordingly, in the antenna module 4000, the antenna apparatuses 1000 and 3000 can be disposed close to each other such that the characteristics of the antenna apparatus 1000 are affected by the antenna apparatus 3000.

Figure 20:
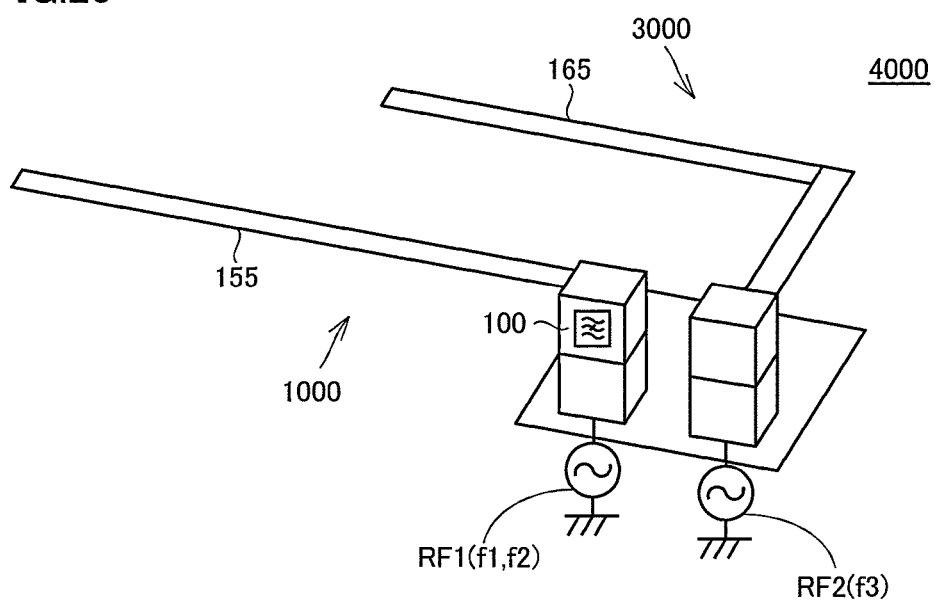
FIG. 20 is an external view of an antenna module according to the third example embodiment of the present invention.

FIG. 20 is an external view of the antenna module 4000 according to the third example embodiment. As illustrated in FIG. 20, the antenna module 4000 includes the antenna apparatuses 1000 and 3000. The antenna apparatus 1000 includes the antenna 155 that is a monopole antenna, the filter device 100, and the feed circuit RF1. The antenna apparatus 3000 includes the antenna 165 that is a monopole antenna and the feed circuit RF2. The antennas 155 and 165 are not limited to a monopole antenna and may be an inverted-F antenna, a loop antenna, or an array antenna. The antenna 155 is connected to the feed circuit RF1 via the filter device 100. The antenna 165 is connected to the feed circuit RF2.

The antenna module 4000 can radiate radio waves in the f1 band, the f2 band, and the f3 band. The antenna module 4000 includes the antenna apparatus 1000 capable of radiating radio waves in the f1 and f2 bands and the antenna apparatus 3000 capable of radiating radio waves in the f3 band.

As described above, the above-described filter devices are designed in consideration of only the inductors L1 and L2 and the capacitors C1 and C2. However, an actual filter device needs to be designed in consideration of, for example, a stray capacitance and a parasitic inductance. A parasitic inductance can be used as the inductor L1 or L2, a parasitic capacitive component that an inductor element itself has can be used as a capacitor, or an inductance component that a capacitor element has can be used as an inductor.

Each of the above-described filter devices may include, at the positions of the terminals P1 and P2, an impedance matching circuit and a switch to switch between paths by path coupling.

Each of the above-described filter devices may be configured as an integrated component. The filter device can therefore be easily disposed in each apparatus without the need to consider the effect of a wiring pattern.

Fourth Example Embodiment

In the first example embodiment, the LC parallel resonator illustrated in FIG. 1 has been described in which the LC series resonator RC1 defined by the series connection between the inductor L1 and the capacitor C1 and the LC series resonator RC2 defined by the series connection between the inductor L2 and the capacitor C2 are connected in parallel to each other. In the second example embodiment, the filter device 110 illustrated in FIG. 4A has been described in which the inductors L1 and L2 are magnetically coupled to each other in the filter device 100 according to the first example embodiment. In the fourth example embodiment, a filter device 300 will be described in which an inductor is provided in parallel to the filter device 110 according to the second example embodiment.

Figure 21:
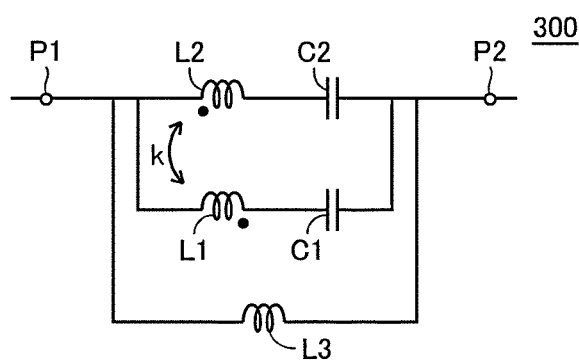
FIG. 21 is a circuit diagram of a filter device according to a fourth example embodiment of the present invention.

FIG. 21 is a circuit diagram of the filter device 300 according to the fourth example embodiment. As illustrated in FIG. 21, the filter device 300 includes the inductors L1 and L2, an inductor L3, and the capacitors C1 and C2. The inductors L1 and L2 are magnetically coupled to each other, but the inductor L3 (a third inductor) is not magnetically coupled to the inductors L1 and L2. A filter device not including the inductor L3 corresponds to the filter device 110 according to the second example embodiment. In the filter device 300 according to the fourth example embodiment, the same reference numeral is used to represent the same configuration as the filter device 100 according to the first example embodiment and the filter device 110 according to the second example embodiment, and the detailed description thereof will not be repeated. In the antenna apparatus 1000 according to the first example embodiment, the filter device 300 according to the fourth example embodiment may be used instead of the filter device 100.

Figure 22A:
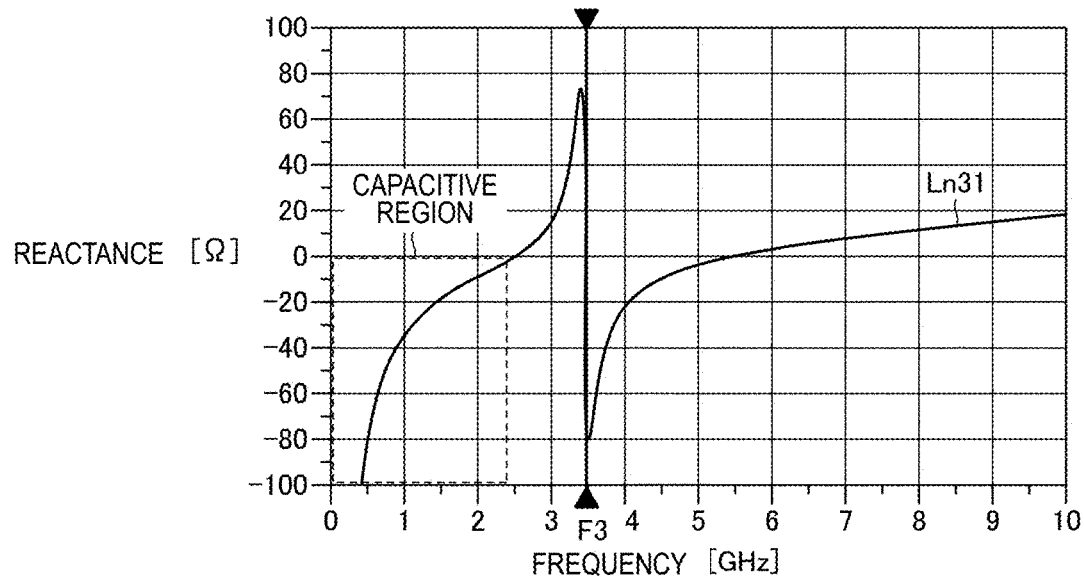
FIGS. 22A and 22B are diagrams illustrating exemplary changes in reactance characteristics before and after the addition of an inductor.
Figure 22B:
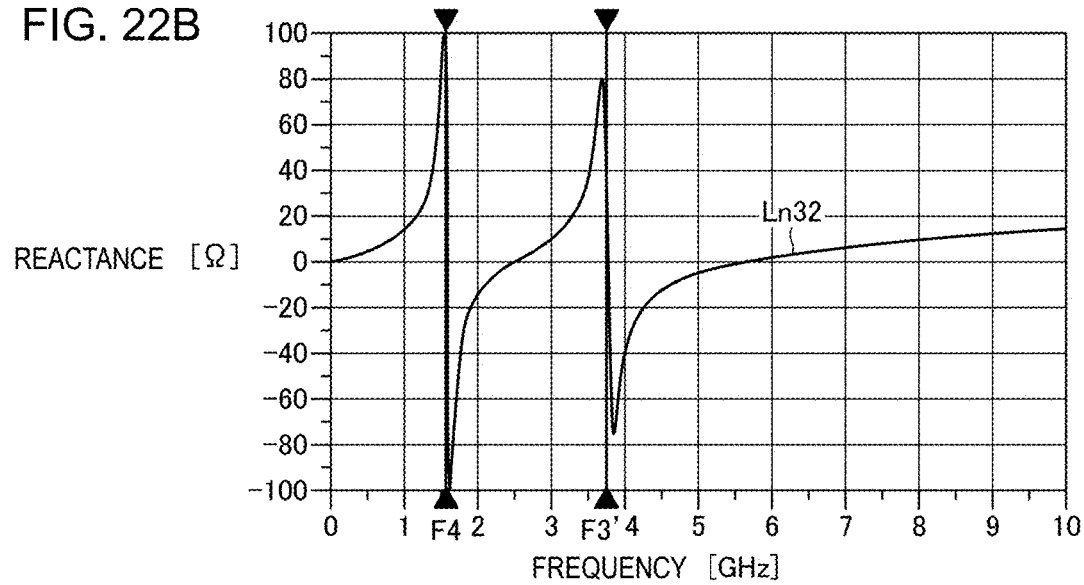

FIGS. 22A and 22B are diagrams illustrating exemplary changes in reactance characteristics before and after the addition of the inductor L3. Referring to FIGS. 22A and 22B, the horizontal axis represents frequency and the vertical axis represents reactance. FIG. 22A is a graph representing exemplary reactance characteristics of the filter device 110 according to the second example embodiment before the addition of the inductor L3. FIG. 22B is a graph representing exemplary reactance characteristics of the filter device 300 according to the fourth example embodiment after the addition of the inductor L3.

Figure 23A:
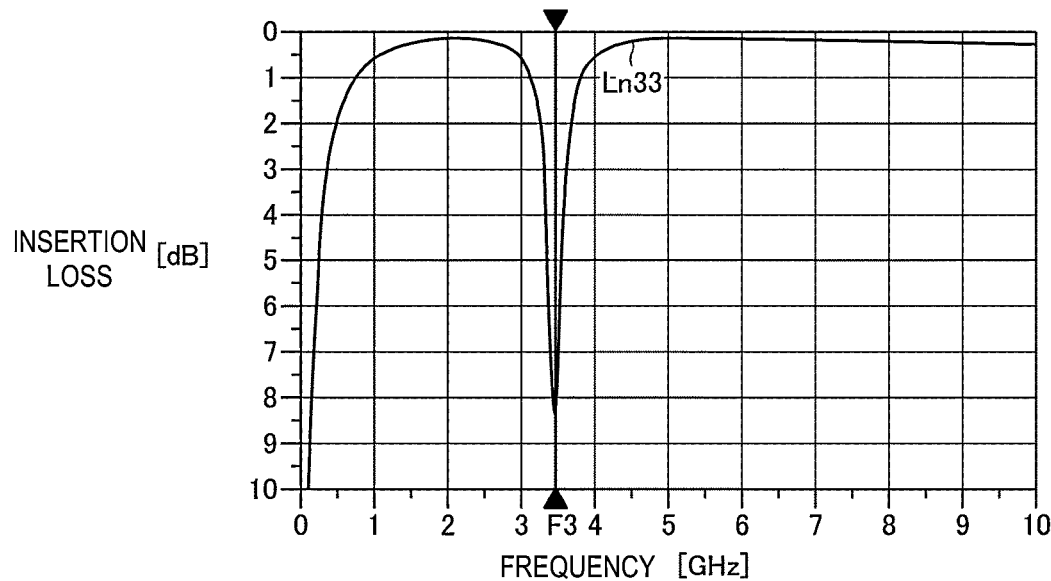
FIGS. 23A and 23B are diagrams illustrating exemplary changes in an insertion loss before and after the addition of an inductor.
Figure 23B:
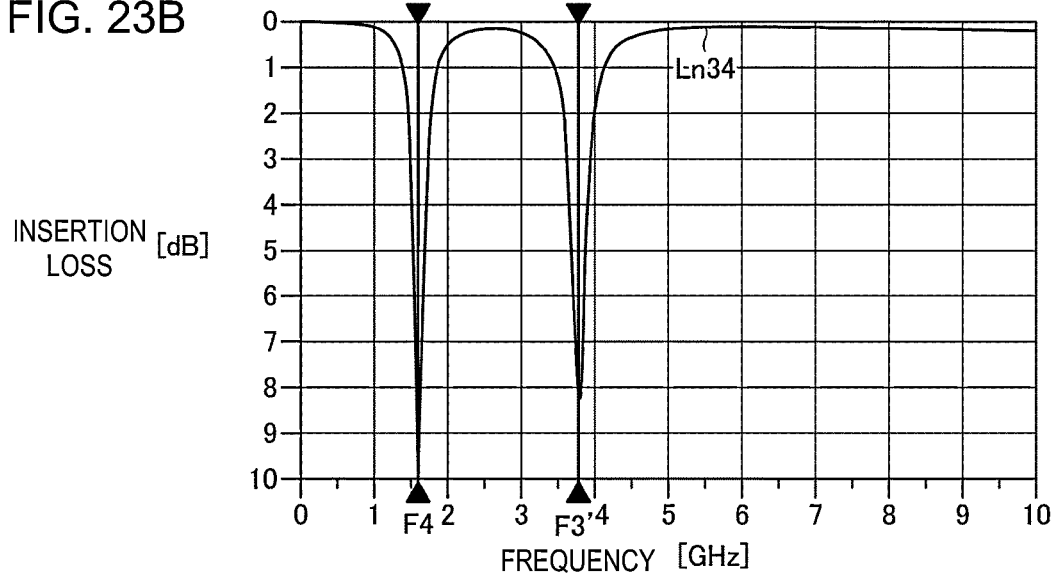

FIGS. 23A and 23B are diagrams illustrating exemplary changes in an insertion loss before and after the addition of the inductor L3. Referring to FIGS. 23A and 23B, the horizontal axis represents frequency and the vertical axis represents insertion loss. FIG. 23A is a graph representing an exemplary insertion loss of the filter device 110 according to the second example embodiment before the addition of the inductor L3. FIG. 23B is a graph representing an exemplary insertion loss of the filter device 300 according to the fourth example embodiment after the addition of the inductor L3.

In FIGS. 22A and 22B, the reactance characteristics of the filter device 110 according to the second example embodiment are represented by a line Ln31 and the reactance characteristics of the filter device 300 according to the fourth example embodiment are represented by a line Ln32. In FIGS. 23A and 23B, the insertion loss of the filter device 110 according to the second example embodiment is represented by a line Ln33 and the insertion loss of the filter device 300 according to the fourth example embodiment is represented by a line Ln34. Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In the filter device 300, a simulation was conducted under example conditions that the inductor L1 had 3.1 nH, the inductor L2 had 1.0 nH, the inductor L3 had 1.6 nH, the capacitor C1 had 0.4 pF, the capacitor C2 had 3.8 pF, and the coupling coefficient k was 0.5. That is, the filter device 300 has the same values as the filter device 110 except for the value of the inductor L3.

As illustrated in FIGS. 22 and 23, the filter device 300 can add a new parallel resonant frequency F4 in a capacitive region by connecting the inductor L3 in parallel. In the filter device 300, the parallel resonant frequency F3 is shifted to a higher-frequency side as represented by F3' in the graph as compared with the filter device 110. Thus, by adding the inductor L3 with no magnetic coupling to the filter device 110 in parallel, the parallel resonant frequency F3 can be shifted to a higher-frequency side. On the other hand, for the addition of the new parallel resonant frequency F4 while such shifting to a higher-frequency side is suppressed, each numerical value may be adjusted. The adjustment of each numerical value will be described with reference to FIGS. 24 and 25.

Figure 24A:
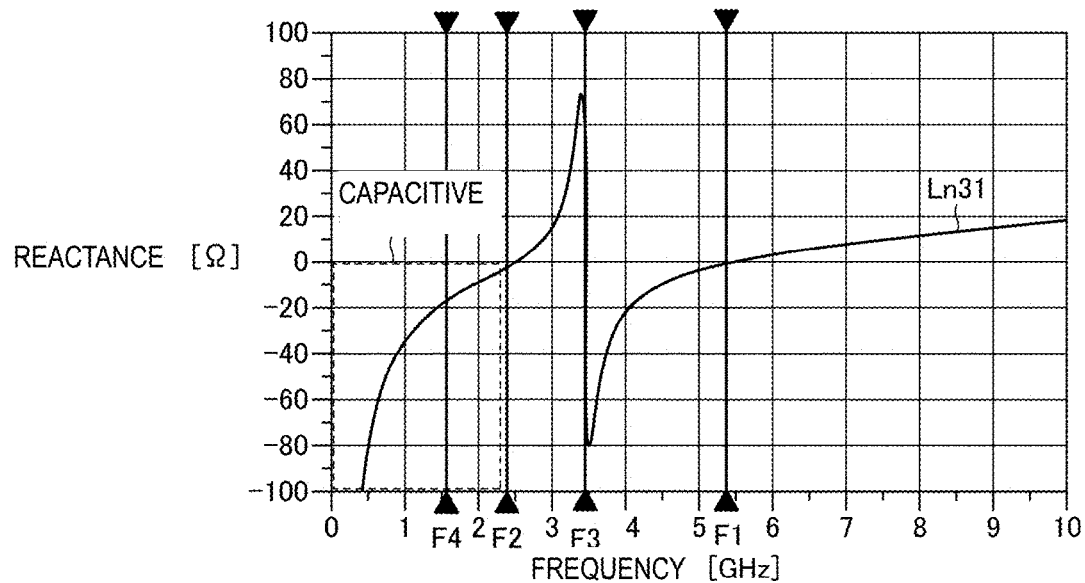
FIGS. 24A and 24B are diagrams illustrating exemplary changes in reactance characteristics before and after the addition of an inductor.
Figure 24B:
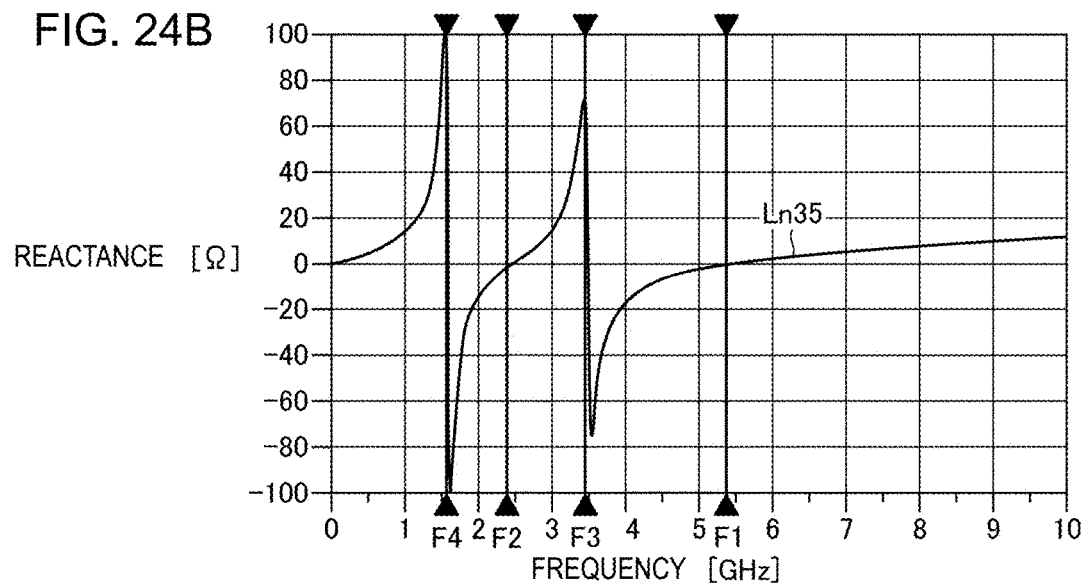

FIGS. 24A and 24B are diagrams illustrating exemplary changes in reactance characteristics before and after the addition of the inductor L3. Referring to FIGS. 24A and 24B, the horizontal axis represents frequency and the vertical axis represents reactance. FIG. 24A is a graph representing exemplary reactance characteristics of the filter device 110 according to the second example embodiment before the addition of the inductor L3. FIG. 24B is a graph representing exemplary reactance characteristics of the filter device 300 according to the fourth example embodiment after the addition of the inductor L3.

Figure 25A:
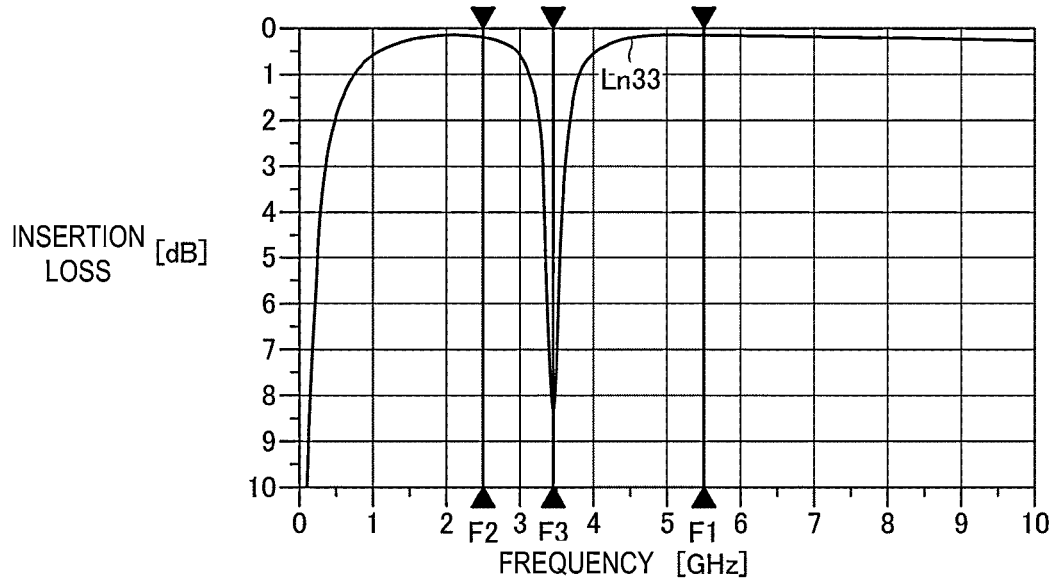
FIGS. 25A and 25B are diagrams illustrating exemplary changes in an insertion loss before and after the addition of an inductor.
Figure 25B:
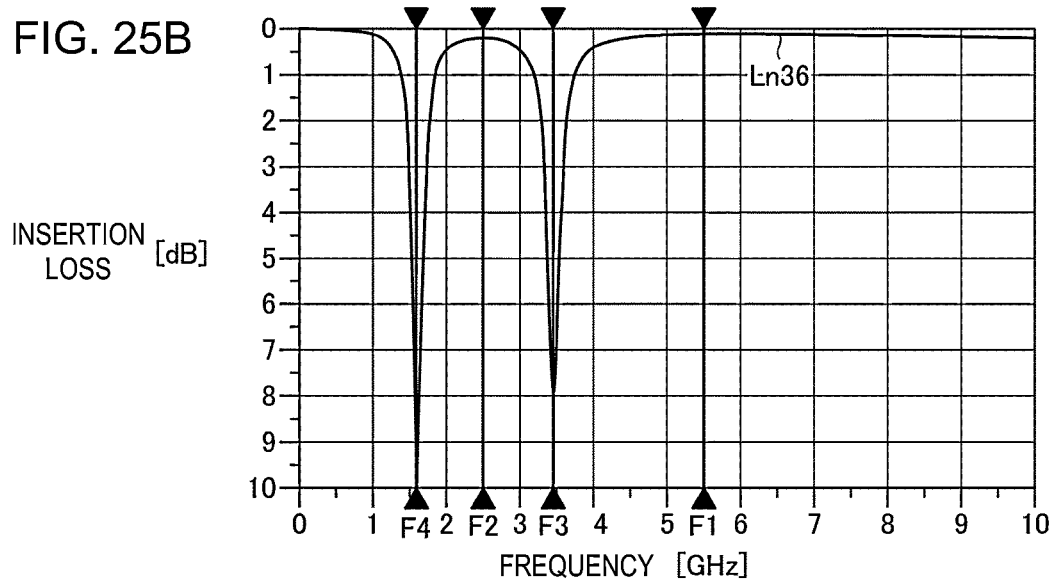

FIGS. 25A and 25B are diagrams illustrating exemplary changes in an insertion loss before and after the addition of the inductor L3. Referring to FIGS. 25A and 25B, the horizontal axis represents frequency and the vertical axis represents insertion loss. FIG. 25A is a graph representing an exemplary insertion loss of the filter device 110 according to the second example embodiment before the addition of the inductor L3. FIG. 25B is a graph representing an exemplary insertion loss of the filter device 300 according to the fourth example embodiment after the addition of the inductor L3.

In FIGS. 24A and 24B, the reactance characteristics of the filter device 110 according to the second example embodiment are represented by the line Ln31 and the reactance characteristics of the filter device 300 according to the fourth example embodiment are represented by a line Ln35. In FIGS. 25A and 25B, the insertion loss of the filter device 110 according to the second example embodiment is represented by the line Ln33 and the insertion loss of the filter device 300 according to the fourth example embodiment is represented by a line Ln36. Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In the filter device 300, a simulation was conducted under example conditions that the inductor L1 had 1.4 nH, the inductor L2 had 1.0 nH, the inductor L3 had 1.5 nH, the capacitor C1 had 0.86 pF, the capacitor C2 had 3.8 pF, and the coupling coefficient k was 0.5. That is, in the filter device 300, the values of the inductor L1, the inductor L3, and the capacitor C1 are changed from those in the filter device 110.

As illustrated in FIGS. 24 and 25, in the filter device 300, the series resonant frequency F1 in the passband (f1 band), the series resonant frequency F2 in the passband (f2 band), and the parallel resonant frequency F3 in the attenuation band (f3 band) can be the same as those in the filter device 110 by adjusting numerical values and the parallel resonant frequency F4 in the attenuation band (f4 band) can be added.

Thus, in the filter device 300, an attenuation band can be added in a capacitive region by providing the inductor L3 in parallel. In addition, even if an attenuation band is added, the filter device 300 can be a trap filter for any purpose by adjusting some of numerical values.

Fifth Example Embodiment

In the first example embodiment, the LC parallel resonator illustrated in FIG. 1 has been described in which the LC series resonator RC1 defined by the series connection between the inductor L1 and the capacitor C1 and the LC series resonator RC2 defined by the series connection between the inductor L2 and the capacitor C2 are connected in parallel to each other. In the second example embodiment, the filter device 110 illustrated in FIG. 4A has been described in which the inductors L1 and L2 are magnetically coupled to each other in the filter device 100 according to the first example embodiment. In the fifth example embodiment, a filter device 400 will be described in which a capacitor is provided in parallel to the filter device 110 according to the second example embodiment.

Figure 26:
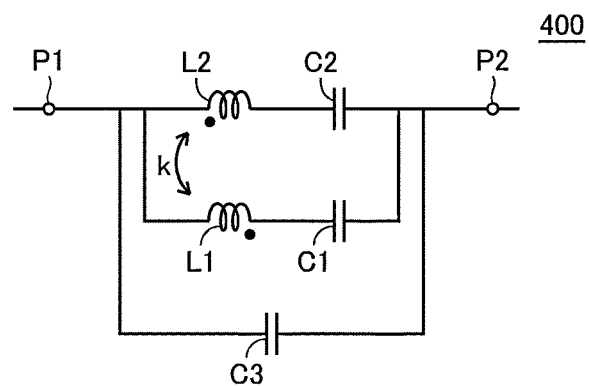
FIG. 26 is a circuit diagram of a filter device according to a fifth example embodiment of the present invention.

FIG. 26 is a circuit diagram of the filter device 400 according to the fifth example embodiment. As illustrated in FIG. 26, the filter device 400 includes the inductors L1 and L2, the capacitors C1 and C2, and a capacitor C3 (third capacitor). The inductors L1 and L2 are magnetically coupled to each other. A filter device not including the capacitor C3 corresponds to the filter device 110 according to the second example embodiment. In the filter device 400 according to the fifth example embodiment, the same reference numeral is used to represent the same configuration as the filter device 100 according to the first example embodiment and the filter device 110 according to the second example embodiment, and the detailed description thereof will not be repeated. In the antenna apparatus 1000 according to the first example embodiment, the filter device 400 according to the fifth example embodiment may be used instead of the filter device 100.

Figure 27A:
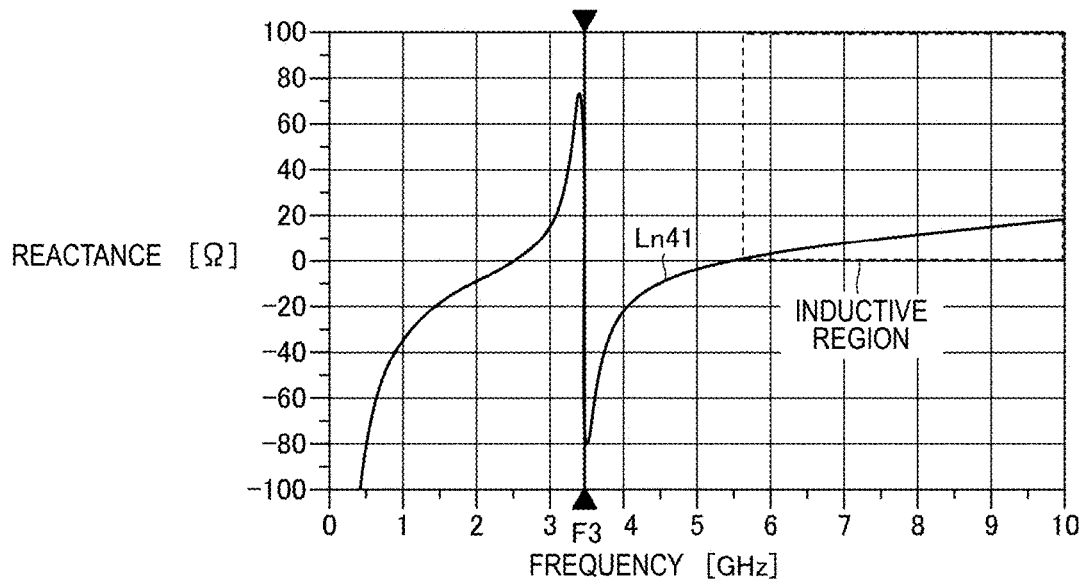
FIGS. 27A and 27B are diagrams illustrating exemplary changes in reactance characteristics before and after the addition of a capacitor.
Figure 27B:
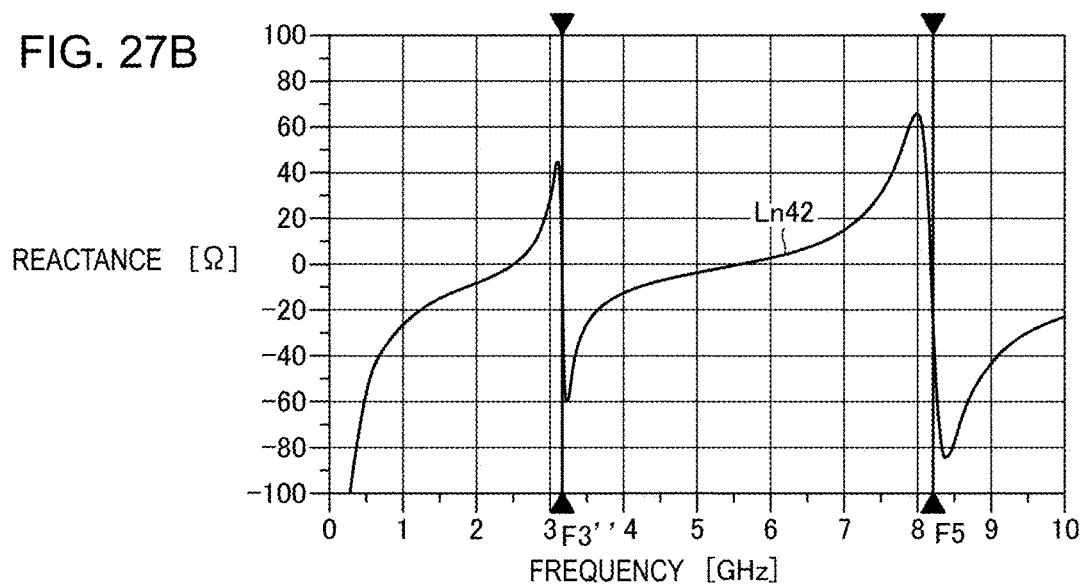

FIGS. 27A and 27B are diagrams illustrating exemplary changes in reactance characteristics before and after the addition of the capacitor C3. Referring to FIGS. 27A and 27B, the horizontal axis represents frequency and the vertical axis represents reactance. FIG. 27A is a graph representing exemplary reactance characteristics of the filter device 110 according to the second example embodiment before the addition of the capacitor C3. FIG. 27B is a graph representing exemplary reactance characteristics of the filter device 400 according to the fifth example embodiment after the addition of the capacitor C3.

Figure 28A:
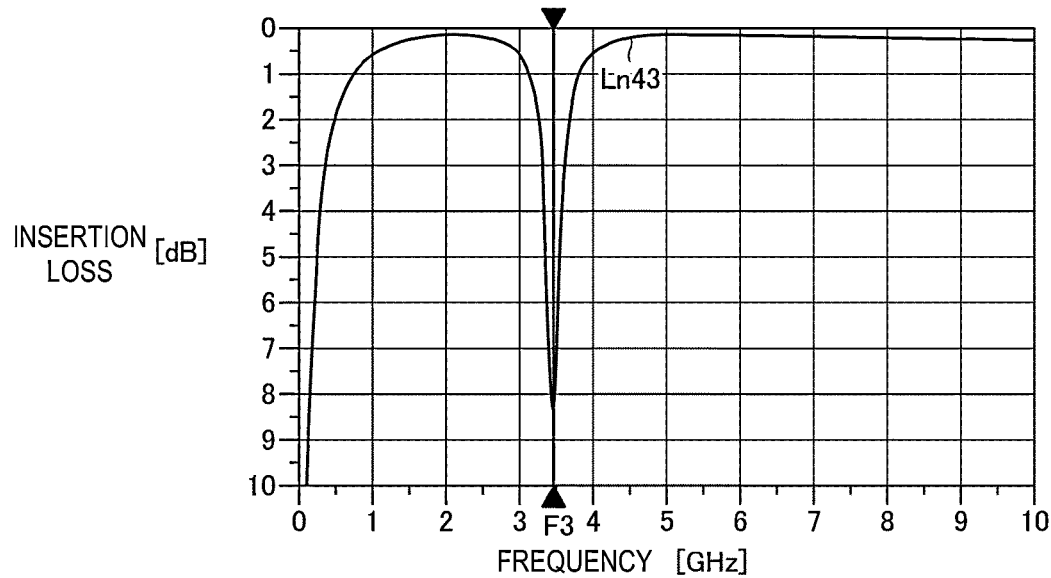
FIGS. 28A and 28B are diagrams illustrating exemplary changes in an insertion loss before and after the addition of a capacitor.
Figure 28B:
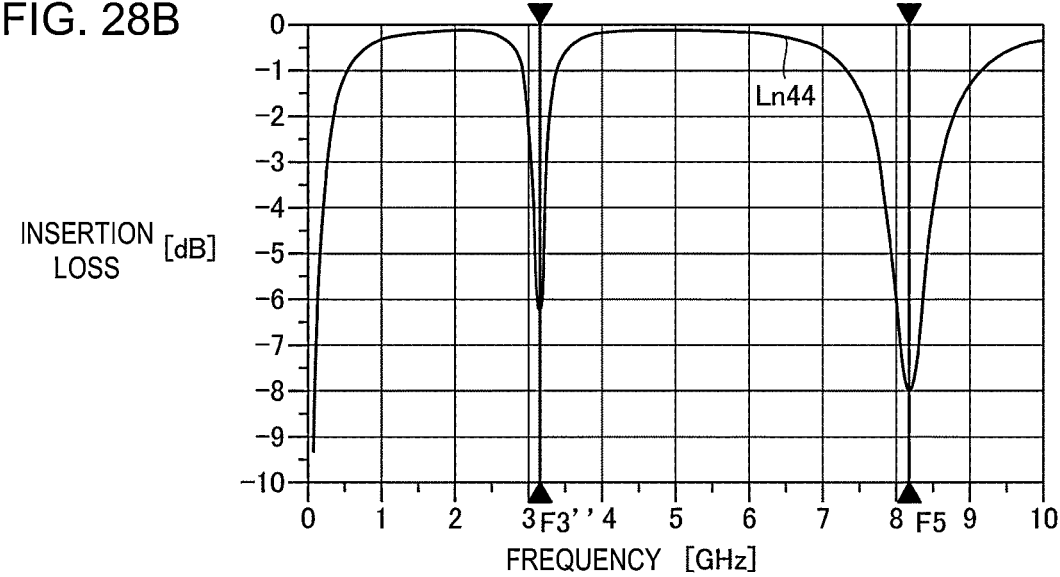

FIGS. 28A and 28B are diagrams illustrating exemplary changes in an insertion loss before and after the addition of the capacitor C3. Referring to FIGS. 28A and 28B, the horizontal axis represents frequency and the vertical axis represents insertion loss. FIG. 28A is a graph representing an exemplary insertion loss of the filter device 110 according to the second example embodiment before the addition of the capacitor C3. FIG. 28B is a graph representing an exemplary insertion loss of the filter device 400 according to the fifth example embodiment after the addition of the capacitor C3.

In FIGS. 27A and 27B, the reactance characteristics of the filter device 110 according to the second example embodiment are represented by a line Ln41 and the reactance characteristics of the filter device 400 according to the fifth example embodiment are represented by a line Ln42. In FIGS. 28A and 28B, the insertion loss of the filter device 110 according to the second example embodiment is represented by a line Ln43 and the insertion loss of the filter device 400 according to the fifth example embodiment is represented by a line Ln44. Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In the filter device 400, a simulation was conducted under example conditions that the inductor L1 had 3.1 nH, the inductor L2 had 1.0 nH, the capacitor C1 had 0.4 pF, the capacitor C2 had 3.8 pF, the capacitor C3 had 1.55 pF, and the coupling coefficient k was 0.5. That is, the filter device 400 has the same values as the filter device 110 except for the value of the capacitor C3.

As illustrated in FIGS. 27 and 28, the filter device 400 can add a new parallel resonant frequency F5 in an inductive region by connecting the capacitor C3 in parallel. In the filter device 400, the parallel resonant frequency F3 is shifted to a lower-frequency side as represented by F3" in the graph as compared with the filter device 110. Thus, by adding the capacitor C3 in parallel to the filter device 110, the parallel resonant frequency F3 can be shifted to a lower-frequency side. On the other hand, for the addition of the new parallel resonant frequency F5 while such shifting of the parallel resonant frequency F3 is suppressed, each numerical value may be adjusted. The adjustment of each numerical value will be described with reference to FIGS. 29 and 30.

Figure 29A:
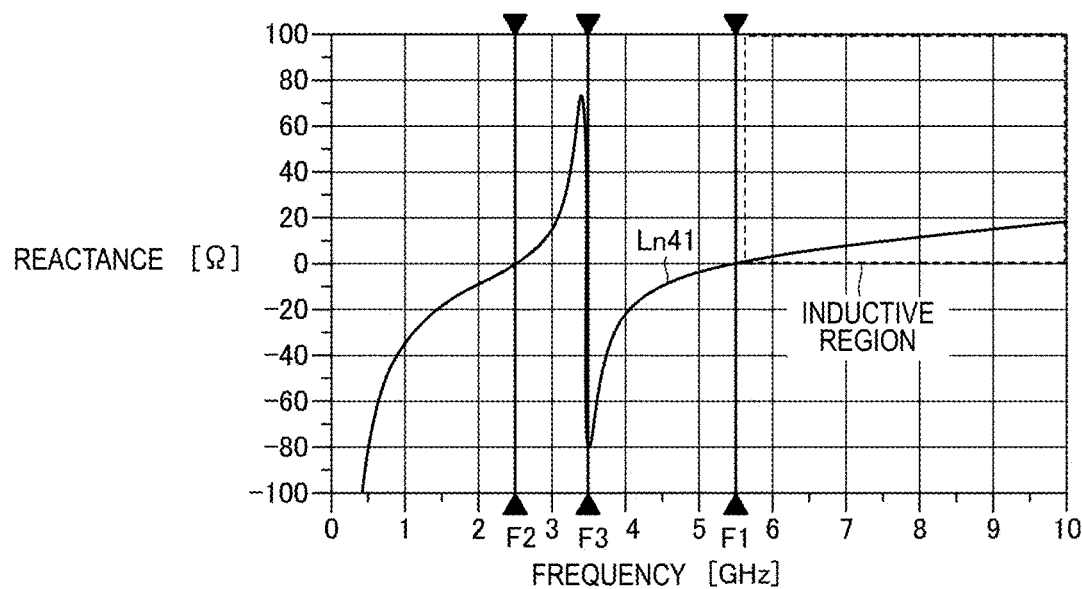
FIGS. 29A and 29B are diagrams illustrating exemplary changes in reactance characteristics before and after the addition of a capacitor.
Figure 29B:
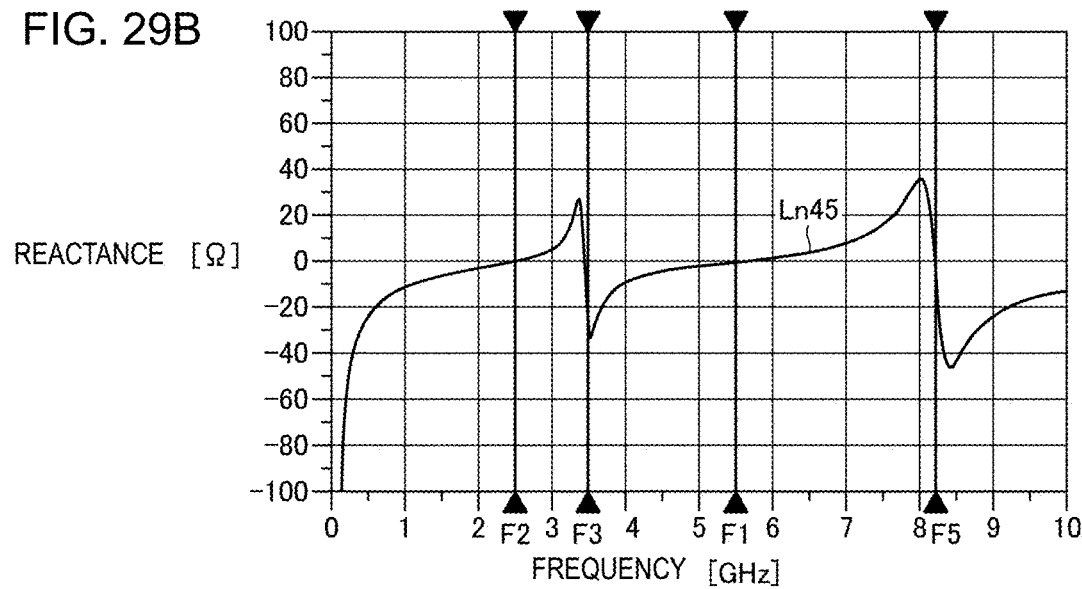

FIGS. 29A and 29B are diagrams illustrating exemplary changes in reactance characteristics before and after the addition of the capacitor C3. Referring to FIGS. 29A and 29B, the horizontal axis represents frequency and the vertical axis represents reactance. The graph on the upper side of FIGS. 29A and 29B represent exemplary reactance characteristics of the filter device 110 according to the second example embodiment before the addition of the capacitor C3. The graph on the lower side of FIGS. 29A and 29B represent exemplary reactance characteristics of the filter device 400 according to the fourth example embodiment after the addition of the capacitor C3.

Figure 30A:
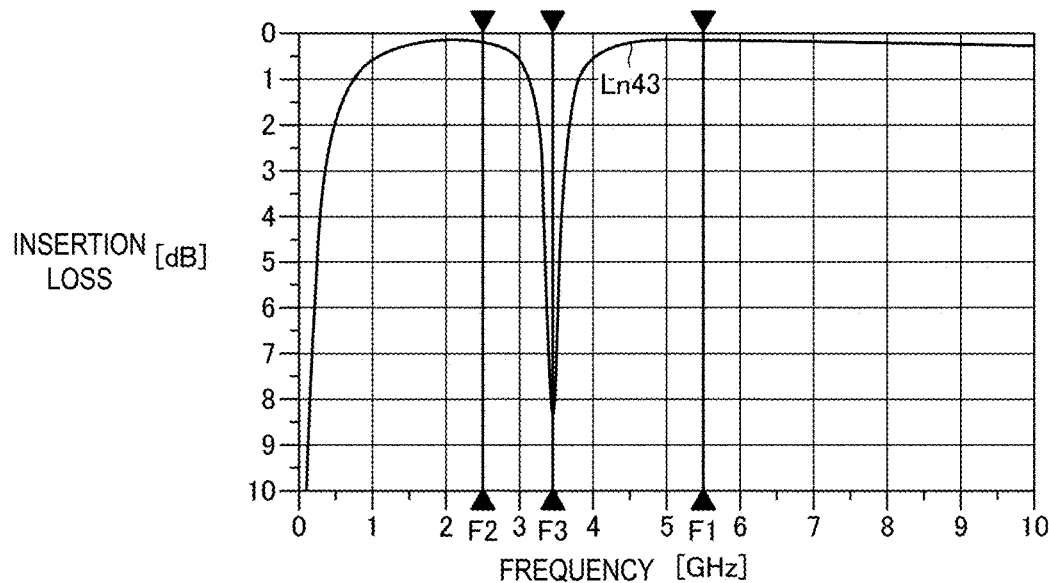
FIGS. 30A and 30B are diagrams illustrating exemplary changes in an insertion loss before and after the addition of a capacitor.
Figure 30B:
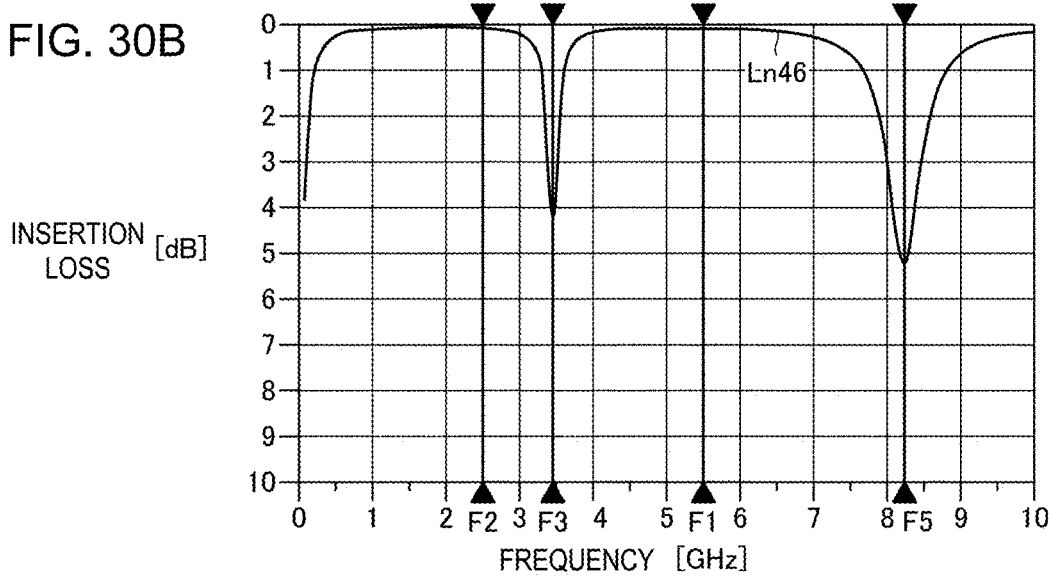

FIGS. 30A and 30B are diagrams illustrating exemplary changes in an insertion loss before and after the addition of the capacitor C3. Referring to FIGS. 30A and 30B, the horizontal axis represents frequency and the vertical axis represents insertion loss. The graph on the upper side of FIGS. 30A and 30B represent an exemplary insertion loss of the filter device 110 according to the second example embodiment before the addition of the capacitor C3. The graph on the lower side of FIGS. 30A and 30B represent an exemplary insertion loss of the filter device 400 according to the fifth example embodiment after the addition of the capacitor C3.

In FIGS. 29A and 29B, the reactance characteristics of the filter device 110 according to the second example embodiment are represented by the line Ln41 and the reactance characteristics of the filter device 400 according to the fifth example embodiment are represented by a line Ln45. In FIGS. 30A and 30B, the insertion loss of the filter device 110 according to the second example embodiment is represented by the line Ln43 and the insertion loss of the filter device 400 according to the fifth example embodiment is represented by a line Ln46. Specifically, in the filter device 110, a simulation was conducted under example conditions that the inductor L1 had 3.1 nH, the inductor L2 had 1.0 nH, the capacitor C1 had 0.4 pF, the capacitor C2 had 3.8 pF, and the coupling coefficient k was 0.5. In the filter device 400, a simulation was conducted under example conditions that the inductor L1 had 3.1 nH, the inductor L2 had 0.38 nH, the capacitor C1 had 0.4 pF, the capacitor C2 had 10 pF, the capacitor C3 had 1.6 pF, and the coupling coefficient k was 0.5. That is, in the filter device 400, the values of the inductor L2, the capacitor C2, and the capacitor C3 are changed from those in the filter device 110.

As illustrated in FIGS. 29 and 30, in the filter device 400, the series resonant frequency F1 in the passband (f1 band), the series resonant frequency F2 in the passband (f2 band), and the parallel resonant frequency F3 in the attenuation band (f3 band) can be the same as those in the filter device 110 by adjusting numerical values and the parallel resonant frequency F5 in the attenuation band (f5 band) can be added. Thus, in the filter device 400, an attenuation band can be added in an inductive region by providing the capacitor C3 in parallel. In addition, even if an attenuation band is added, the filter device 400 can be a trap filter for any purpose by adjusting some of numerical values.

The filter device 110 may have a configuration in which the inductor L3 is added in parallel and the capacitor C3 is connected in parallel to the inductor L3. In such a case, attenuation bands can be added in a capacitive region and an inductive region. The filter device 110 may be of an integrated type by incorporating the inductor L3 and the capacitor C3, or the parallel resonant frequency of the filter device 110 may be adjusted using an inductor element and a capacitor element that are separated from the filter element 110. By using an inductor element and a capacitor element that are separated from the filter element 110, the adjustment of a frequency reflecting the characteristics of each component when it is incorporated in the antenna apparatus 1000 is easily performed.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a first series resonator to resonate in series at a first resonant frequency with a first inductor and a first capacitor connected in series to the first inductor; and
a second series resonator to resonate in series at a second resonant frequency with a second inductor and a second capacitor connected in series to the second inductor; wherein
the first series resonator and the second series resonator are connected in parallel to each other and resonate in parallel at a third resonant frequency;
the second resonant frequency is lower than the first resonant frequency; and
the third resonant frequency is between the first resonant frequency and the second resonant frequency.

2. The filter device according to claim 1, wherein the first inductor and the second inductor are magnetically coupled to each other.

3. The filter device according to claim 2, wherein the first inductor and the second inductor are coupled to each other in positive polarity.

4. The filter device according to claim 2, wherein the first inductor and the second inductor are coupled to each other in subtractive polarity.

5. The filter device according to claim 1, wherein the first inductor is a parasitic inductance.

6. The filter device according to claim 1, wherein the filter device is provided in an antenna apparatus capable of radiating the first resonant frequency and the second resonant frequency as resonant frequencies.

7. The filter device according to claim 1, wherein the filter device is an integrated component.

8. The filter device according to claim 1, further comprising a third capacitor or a third inductor that is connected in parallel to the first series resonator and the second series resonator.

9. The filter device according to claim 7, further comprising:
- a third capacitor or a third inductor that is connected in parallel to the first series resonator and the second series resonator;
- an input terminal connected to one end of the first series resonator and one end of the second series resonator; and
- an output terminal connected to another end of the first series resonator and another end of the second series resonator; wherein
- the third capacitor or the third inductor is connected between the input terminal and the output terminal as a separate element.

10. An antenna apparatus comprising:
- a first feed circuit to receive or output a radio frequency signal;
- a first antenna to radiate the first resonant frequency or the second resonant frequency as resonant frequencies; and
- the filter device according to claim 1, the filter device being between the first feed circuit and the first antenna.

11. The antenna apparatus according to claim 10, wherein the first inductor and the second inductor are magnetically coupled to each other.

12. The antenna apparatus according to claim 11, wherein the first inductor and the second inductor are coupled to each other in positive polarity.

13. The antenna apparatus according to claim 11, wherein the first inductor and the second inductor are coupled to each other in subtractive polarity.

14. The antenna apparatus according to claim 10, wherein the first inductor is a parasitic inductance.

15. The antenna apparatus according to claim 10, wherein the filter device is an integrated component.

16. An antenna module comprising:
- a first antenna apparatus; and
- a second antenna apparatus;
- the first antenna apparatus including:
  - a first feed circuit to receive/output a radio frequency signal;
  - a first antenna to radiate a first resonant frequency and a second resonant frequency as resonant frequencies; and
  - a filter device between the first feed circuit and the first antenna;
- the filter device having a passband in a first frequency band, a passband in a second frequency band lower than the first frequency band, and an attenuation band in a third band between the first frequency band and the second frequency band;
- the filter device including:
  - a first series resonator to resonate in series at the first resonant frequency in the first frequency band with a first inductor and a first capacitor connected in series to the first inductor; and
  - a second series resonator to resonate in series at the second resonant frequency in the second frequency band with a second inductor and a second capacitor connected in series to the second inductor;
  - the first series resonator and the second series resonator being connected in parallel and resonating in parallel at a third resonant frequency in the third frequency band;
- the second antenna apparatus including:
  - a second feed circuit to receive/output a radio frequency signal; and
  - a second antenna to radiate the third resonant frequency as a resonant frequency;
- the first antenna apparatus and the second antenna apparatus being adjacent to or in a vicinity of each other.

17. The antenna module according to claim 16, wherein the first inductor and the second inductor are magnetically coupled to each other.

18. The antenna module according to claim 17, wherein the first inductor and the second inductor are coupled to each other in positive polarity.

19. The antenna module according to claim 17, wherein the first inductor and the second inductor are coupled to each other in subtractive polarity.

20. The antenna module according to claim 16, wherein the first inductor is a parasitic inductance.

* * * * *